United States Patent
Yoon

(10) Patent No.: US 11,038,091 B2
(45) Date of Patent: Jun. 15, 2021

(54) LIGHT-EMITTING DEVICE PACKAGES

(71) Applicant: Samsung Electronics Co., Ltd., Suwon-si (KR)

(72) Inventor: Youngjeong Yoon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 8 days.

(21) Appl. No.: 16/561,680

(22) Filed: Sep. 5, 2019

(65) Prior Publication Data
US 2020/0303609 A1  Sep. 24, 2020

(30) Foreign Application Priority Data

Mar. 22, 2019 (KR) .......................... 10-2019-0032727

(51) Int. Cl.
| | |
|---|---|
| H01L 33/62 | (2010.01) |
| H01L 23/00 | (2006.01) |
| H01L 25/16 | (2006.01) |
| H01L 33/50 | (2010.01) |
| H01L 33/54 | (2010.01) |

(Continued)

(52) U.S. Cl.
CPC ............ *H01L 33/62* (2013.01); *H01L 24/32* (2013.01); *H01L 24/48* (2013.01); *H01L 24/73* (2013.01); *H01L 25/162* (2013.01); *H01L 25/167* (2013.01); *H01L 33/505* (2013.01); *H01L 33/54* (2013.01); *H01L 33/644* (2013.01); *H01L 33/32* (2013.01); *H01L 33/382* (2013.01); *H01L 33/507* (2013.01); *H01L 2224/32245* (2013.01); *H01L 2224/48175* (2013.01); *H01L 2224/73265* (2013.01); *H01L 2933/005* (2013.01);

(Continued)

(58) Field of Classification Search
CPC combination set(s) only.
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |

(Continued)

FOREIGN PATENT DOCUMENTS

| EP | 2490270 A2 | 8/2012 |
| EP | 3416202 A1 | 12/2018 |

(Continued)

OTHER PUBLICATIONS

Extended European Search Report dated Mar. 18, 2020 for corresponding European Application No. 19203156.5.

*Primary Examiner* — Mamadou L Diallo
(74) *Attorney, Agent, or Firm* — Harness, Dickey & Pierce, P.L.C.

(57) ABSTRACT

Light-emitting device packages include a package substrate surrounded by a lower molding member, a light-emitting device on the package substrate and surrounded by an upper molding member, a heat conductive pad between a lower surface of the light-emitting device and an upper surface of the package substrate, a first electrode on an upper surface of the light-emitting device, a second electrode on the upper surface of the light-emitting device, a fluorescent material on the upper surface of the light-emitting device, and a plurality of bonding wires electrically connecting the package substrate with separate, respective electrodes of the first electrode and the second electrode.

20 Claims, 22 Drawing Sheets

(51) Int. Cl.
*H01L 33/64* (2010.01)
*H01L 33/32* (2010.01)
*H01L 33/38* (2010.01)

(52) U.S. Cl.
CPC ............... *H01L 2933/0033* (2013.01); *H01L 2933/0041* (2013.01); *H01L 2933/0066* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,138,509 B2 | 3/2012 | Lin et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,723,192 B2 | 5/2014 | Weidner et al. | |
| 8,735,931 B2 | 5/2014 | Han et al. | |
| 8,766,295 B2 | 7/2014 | Kim | |
| 8,890,297 B2 * | 11/2014 | Won | H01L 33/505 257/678 |
| 8,987,022 B2 | 3/2015 | Yoo et al. | |
| 9,601,472 B2 | 3/2017 | Keser et al. | |
| 9,806,063 B2 | 10/2017 | Kim et al. | |
| 10,134,668 B2 | 11/2018 | Liu et al. | |
| 2010/0314635 A1 | 12/2010 | Brunner et al. | |
| 2011/0031502 A1 | 2/2011 | Bergmann et al. | |
| 2016/0343646 A1 | 11/2016 | Alvarado et al. | |
| 2017/0294557 A1 | 10/2017 | Chen et al. | |
| 2018/0226552 A1 | 8/2018 | Lee et al. | |
| 2018/0266649 A1 * | 9/2018 | Kang | F21S 45/10 |
| 2018/0286902 A1 | 10/2018 | Hokari et al. | |
| 2018/0315898 A1 * | 11/2018 | Chen | B82Y 40/00 |
| 2018/0347029 A1 | 12/2018 | Yang et al. | |
| 2019/0086039 A1 * | 3/2019 | Lee | H01L 33/52 |

FOREIGN PATENT DOCUMENTS

| | | |
|---|---|---|
| JP | 10-2009-188187 A | 8/2009 |
| JP | 2009-188187 A | 8/2009 |
| JP | 5148126 B2 | 2/2013 |
| JP | 5846560 B2 | 1/2016 |
| JP | 2016-167540 A | 9/2016 |
| JP | 6073428 B2 | 2/2017 |
| KR | 10-2015-0035176 A | 4/2015 |
| KR | 10-1724702 B1 | 4/2017 |

* cited by examiner

LIGHT-EMITTING DEVICE PACKAGES

CROSS-REFERENCE TO RELATED APPLICATION

This application claims the benefit of Korean Patent Application No. 10-2019-0032727, filed on Mar. 22, 2019, in the Korean Intellectual Property Office, the disclosure of which is incorporated herein in its entirety by reference.

BACKGROUND

The inventive concepts relate to light-emitting device packages, and more particularly, to light-emitting device packages having improved light extraction efficiency and heat resistance efficiency.

Recently, because the sizes of light-emitting devices have been reduced, light-emitting device packages which are capable of improving light extraction efficiency and heat resistance efficiency, while having stability, have been increasingly desired. Thus, research has been conducted in order to increase the light extraction efficiency and heat resistance efficiency of light-emitting devices in light-emitting device packages.

SUMMARY

The inventive concepts provide light-emitting device packages having a structure configured to provide effectively increased efficiency of extraction of light emitted from one or more light-emitting devices in the light-emitting device packages and to provide effectively increased heat resistance efficiency of one or more light-emitting devices in the light-emitting device packages.

According to some example embodiments, a light-emitting device package may include a package substrate surrounded by a lower molding member, a light-emitting device on the package substrate, the light-emitting device surrounded by an upper molding member, a heat conductive pad between a lower surface of the light-emitting device and an upper surface of the package substrate, a first electrode on an upper surface of the light-emitting device, a second electrode on the upper surface of the light-emitting device, and a fluorescent material on the upper surface of the light-emitting device, and a plurality of bonding wires electrically connecting the package substrate with separate, respective electrodes of the first electrode and the second electrode.

According to some example embodiments, a light-emitting device package may include a package substrate including a first electrode frame and a second electrode frame, a light-emitting device adjacent to the package substrate, a side surface of the light-emitting device and a side surface of the package substrate facing each other, a heat conductive material layer on a lower surface of the light-emitting device, a first electrode on an upper surface of the light-emitting device, a second electrode on the upper surface of the light-emitting device, and a fluorescent material on the upper surface of the light-emitting device, a plurality of bonding wires electrically connecting the first electrode frame with the first electrode and electrically connecting the second electrode frame with the second electrode, and a molding member surrounding both the package substrate and the light-emitting device.

According to some example embodiments, a light-emitting device package may include a package substrate surrounded by a lower molding member, a plurality of light-emitting devices surrounded by an upper molding member, the plurality of light-emitting devices on the package substrate, a heat conductive pad between a lower surface of each light-emitting device of the plurality of light-emitting devices and an upper surface of the package substrate, a separate first electrode on an upper surface of each light-emitting device of the plurality of light-emitting devices, a separate second electrode on the upper surface of each light-emitting device of the plurality of light-emitting devices, and a separate fluorescent material on the upper surface of each light-emitting device of the plurality of light-emitting devices, and a plurality of bonding wires electrically connecting the package substrate with each electrode of the first electrode and the second electrode.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, some example embodiments of the inventive concepts will be described in detail with reference to the accompanying drawings.

FIGS. 1A, 1B, 1C, and 1D are views of a light-emitting device package 10 according to some example embodiments of the inventive concepts.

Figure 1A:
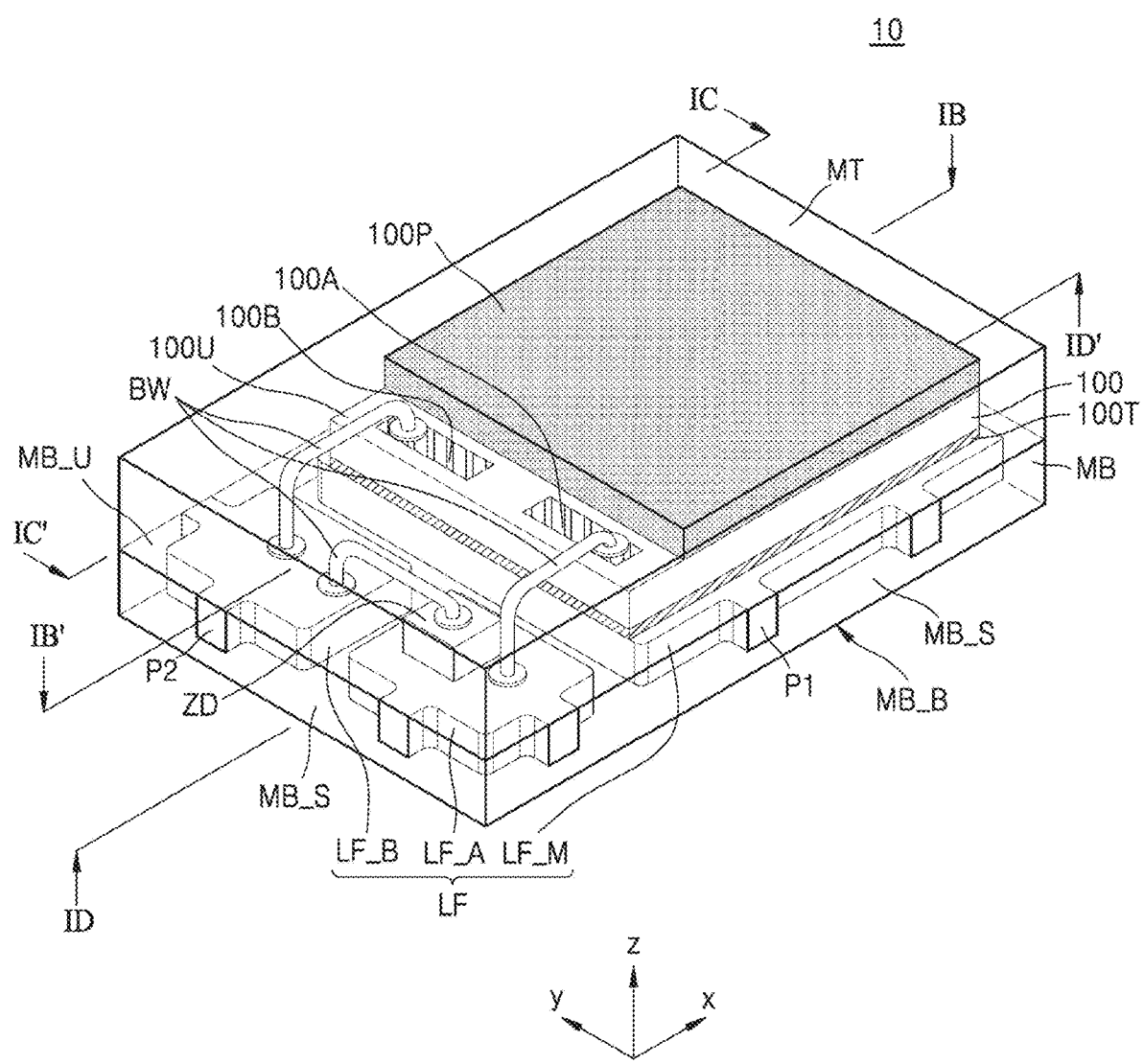
FIGS. 1A, 1B, 1C, and 1D are views of a light-emitting device package according to some example embodiments of the inventive concepts.
Figure 1B:
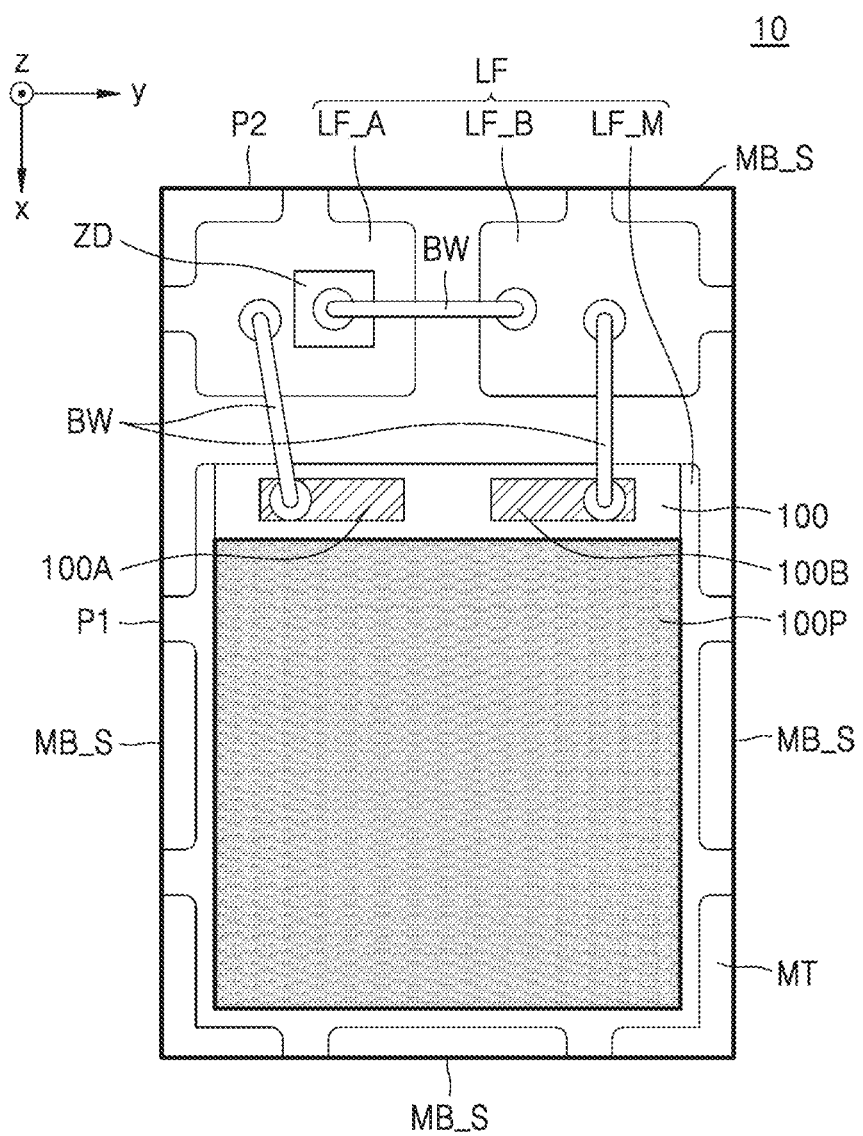
Figure 1C:
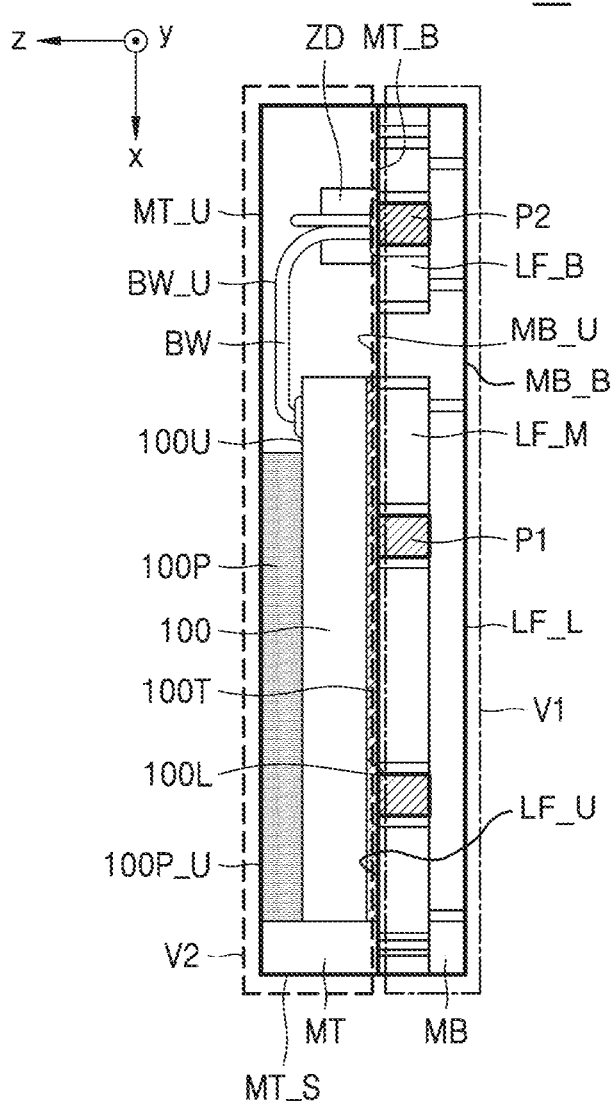
Figure 1D:
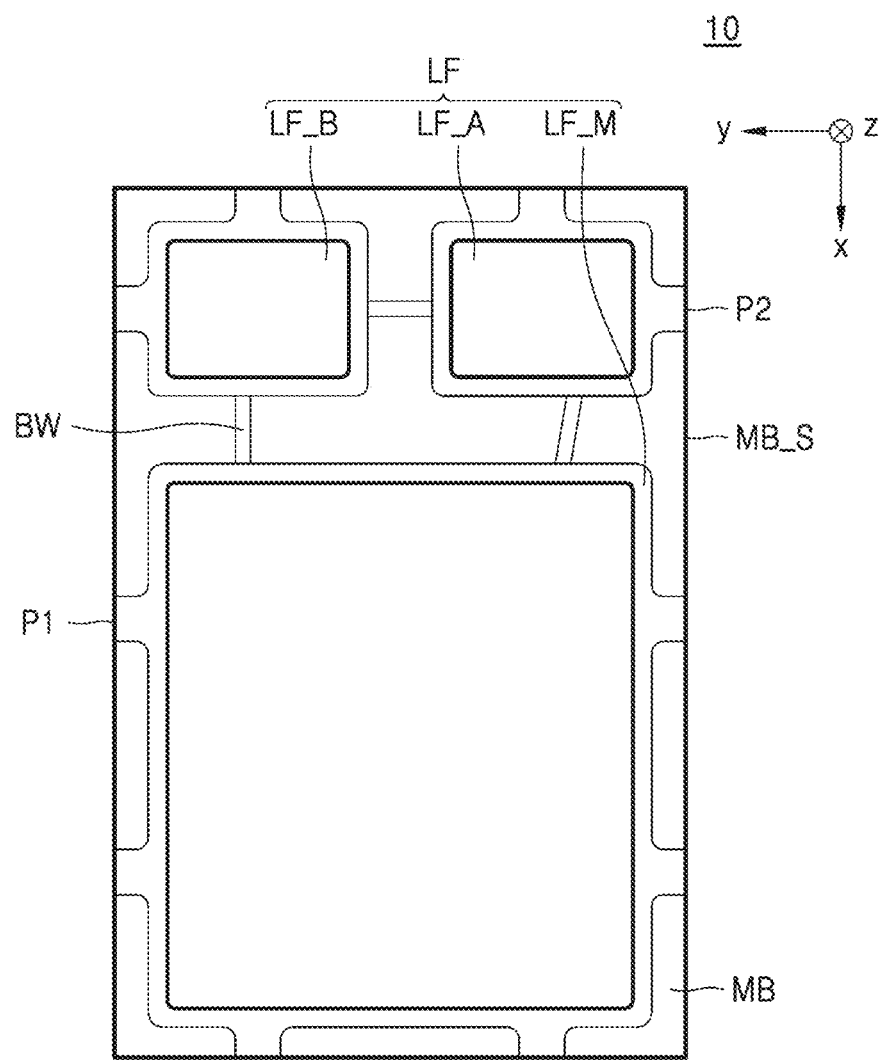

In detail, FIG. 1A is a perspective view of the light-emitting device package 10, FIG. 1B is a plan view of the light-emitting device package 10 along view line IB-IB', FIG. 1C is a side view of the light-emitting device package 10 along view line IC-IC', and FIG. 1D is a bottom view of the light-emitting device package 10 along view line ID-ID'. In some example embodiments, for convenience of explanation, an upper molding member MT and a lower molding member MB are illustrated to be transparent, but it will be understood that example embodiments are not limited thereto. For example, the upper molding member MT and/or the lower molding member MB may be translucent, opaque, or any combination thereof.

Referring to FIGS. 1A through 1D altogether, the light-emitting device package 10 may include a lead frame LF surrounded by the lower molding member MB, a light-emitting device 100 surrounded by the upper molding member MT and arranged above the lead frame LF such that the light-emitting device 100 is on the lead frame LF, a heat conductive pad 100T arranged between a lower surface 100L of the light-emitting device 100 and an upper surface LF_U of the lead frame LF, a first electrode 100A, a second electrode 100B, and a fluorescent material 100P arranged on an upper surface 100U of the light-emitting device 100, and a plurality of bonding wires BW that each electrically connect a separate, respective electrode of the first electrode 100A and the second electrode 100B with the lead frame LF and thereby the bonding wires BW electrically connect the lead frame LF with separate, respective electrodes of the first electrode 100A and the second electrodes 100B.

As referred to herein, an element that is "on" another element may be "above" or "beneath" the other element. Additionally, an element that is "on" another element may be "directly" on the other element, such that the element is in direct contact with the other element, or may be "indirectly" on the other element, such that the element is isolated from direct contact with the other element by one or more interposing spaces and/or structures.

As shown in FIGS. 1A-1D, the lead frame LF may include a main frame LF_M above which the light-emitting device 100 is arranged (e.g., the light-emitting device 100 is on the main frame LF_M), a first electrode frame LF_A connected to the first electrode 100A through at least one bonding wire BW of the plurality of bonding wires BW, and a second electrode frame LF_B connected to the second electrode 100B through at least one other bonding wire BW of the plurality of bonding wires BW. As shown in FIGS. 1A-1D, the light-emitting device 100 may be exclusively on the main frame LF_M in relation to the first and second electrode frames LF_A and LF_B. The lead frame LF may function as a substrate of a package in the light-emitting device package 10, and thus, the lead frame LF may be referred to interchangeably herein as a package substrate, and the upper surface LF_U of the lead frame LF may be referred to interchangeably herein as an upper surface of the package substrate.

The lead frame LF may include a metal material having electrical conductivity, such as copper (Cu). However, the lead frame LF is not limited thereto. The lead frame LF may be formed by using an injection molding method. In some example embodiments, an outer surface of the lead frame LF may be plated. For example, an upper surface and a lower surface of the lead frame LF may be plated with silver (Ag), gold (Au), etc.

As shown in FIGS. 1A-1D, the main frame LF_M, the first electrode frame LF_A, and the second electrode frame LF_B may be physically separated from one another (e.g., isolated from direct contact with each other) by, and may each be surrounded by, the lower molding member MB. The main frame LF_M may discharge the heat generated in the light-emitting device 100 to the outside (i.e., an exterior of the light-emitting device package 10). The light-emitting device 100 may be stably supported and fixed by the main frame LF_M, by being coupled to the main frame LF_M. In some example embodiments, because a contact area between the main frame LF_M and the light-emitting device 100 is large, heat radiation efficiency and heat resistance efficiency of the light-emitting device 100 may further be enhanced. In some example embodiments, the first electrode frame LF_A and the second electrode frame LF_B may provide power supply to the light-emitting device 100.

The main frame LF_M may be arranged under the light-emitting device 100 and the first and second electrode frames LF_A and LF_B may be arranged at a side surface of the main frame LF_M in parallel with each other. The area of the main frame LF_M may be greater than those of the first and second electrode frames LF_A and LF_B. In some example embodiments, the main frame LF_M, the first electrode frame LF_A, and the second electrode frame LF_B may be provided as separate members. In some example embodiments, the main frame LF_M, the first electrode frame LF_A, and the second electrode frame LF_B may be integrally provided.

The lower molding member MB may be formed around the lead frame LF to surround the lead frame LF. The lead frame LF may be separated into the main frame LF_M, the first electrode frame LF_A, and the second electrode frame LF_B by the lower molding member MB. In other words, the lead frame LF may be separated into the portions isolated from direct contact with each other and electrically insulated from one another by the lower molding member MB.

It will be understood that an element that surrounds another element may partially extend around the other element and thus expose one or more portions of the other element such the one or more portions of the other element extend through the surrounded element and may be exposed. Restated, an element that surrounds another element, as described herein, will be understood to refer to an element extending around one or more surfaces of the surrounded element such that the outer surfaces of the surrounding element define a volume space in which the surrounded element is partially or entirely located within.

For example, as shown in FIGS. 1A-1D, the lower molding member MB may surround the lead frame LF, such that the outer surfaces of the lower molding member MB, upper surface MB_U, side surfaces MB_S, and bottom surface MB_B, define a volume space V1 in which the lead frame LF is entirely located (e.g., encompassed) within, while some portions and/or surfaces of the lead frame LF may be exposed through the lower molding member MB. Additionally, as shown in FIGS. 1A-1D, the upper molding member MT may surround at least the light-emitting device 100 such that outer surfaces of the upper molding member MT, upper surface MT_U, side surfaces MT_S, and bottom surface MT_B, define a volume space V2 in which at least the light-emitting device 100 is entirely located (e.g., encompassed) within. Similarly, the fluorescent material 100P, bonding wires BW, first and second electrodes 100A and 100B, heat conductive pad 100T, and Zenger diode ZD are entirely located (e.g., encompassed) within volume space V2 and are thus surrounded by the upper molding member MT. The main frame LF_M may include at least one first projection portion P1 extending through and exposed through the lower molding member MB. In some example embodiments, each of the first electrode frame LF_A and the second electrode frame LF_B may include at least one second projection portion P2 extending through and exposed through the lower molding member MB. The first and second projection portions P1 and P2 may be formed based on methods of manufacturing a light-emitting device package, according to the inventive concepts.

As further shown in at least FIG. 1C, the upper surface LF_U of the lead frame LF may be exposed through the lower molding member MB.

The lower molding member MB may include, for example, an epoxy molding compound. In some example embodiments, the lower molding member MB is not limited to an epoxy molding compound, and may include various materials, such as an epoxy-based material, a thermosetting material, a thermoplastic material, a UV processing material, etc.

Each of the upper surface MB_U and a lower surface MB_B of the lower molding member MB may have a flat shape, as shown in FIGS. 1A-1D. In some example embodiments, each of the upper surface LF_U and a lower surface LF_L of the lead frame LF may have a flat shape. In some example embodiments, the upper surface MB_U of the lower molding member MB may be on the same plane as (e.g., may be coplanar with) the upper surface LF_U of the lead frame LF and the lower surface MB_B of the lower molding member MB may be on the same plane as the lower surface LF_L of the lead frame LF. That is, a thickness of the lower molding member MB may be substantially the same (e.g., the same within manufacturing tolerances and/or material tolerances) as a thickness of the lead frame LF.

The light-emitting device 100 may include a semiconductor device emitting light having certain energy (e.g., light in a particular wavelength spectrum). The first electrode 100A and the second electrode 100B may be exposed on the upper surface 100U of the light-emitting device 100 and the fluorescent material 100P having a certain thickness may be arranged on the upper surface 100U of the light-emitting device 100. In some example embodiments, the heat conductive pad 100T having a certain thickness may be arranged on the lower surface 100L of the light-emitting device 100. The light-emitting device 100 may be stably supported and fixed by the main frame LF_M. Detailed aspects of the light-emitting device 100 will be described below.

Figure 2A:
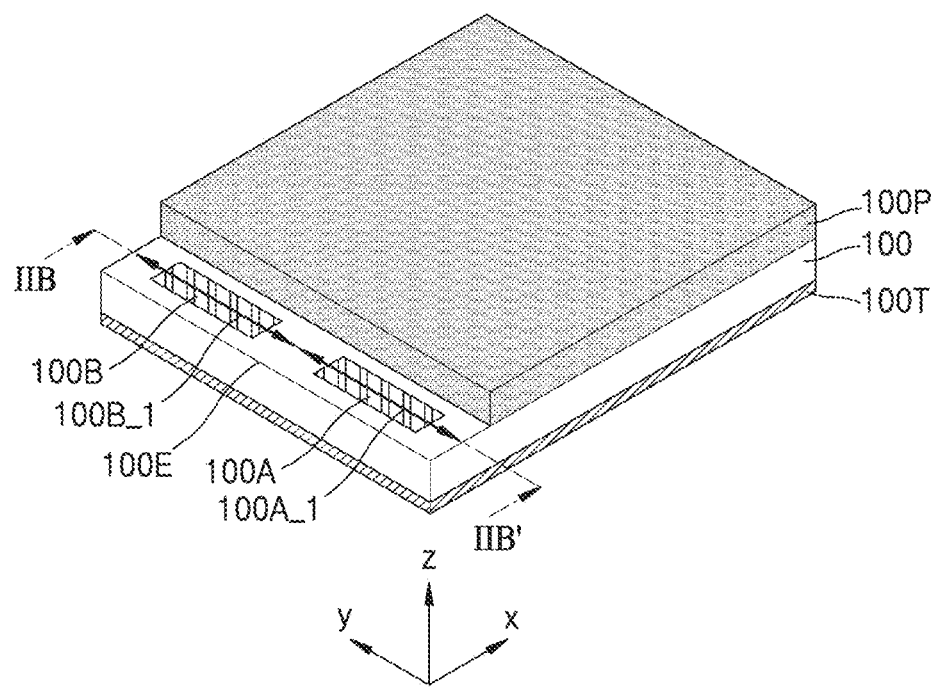
FIGS. 2A and 2B are views of the light-emitting device included in a light-emitting device package according to some example embodiments of the inventive concepts.
Figure 2B:
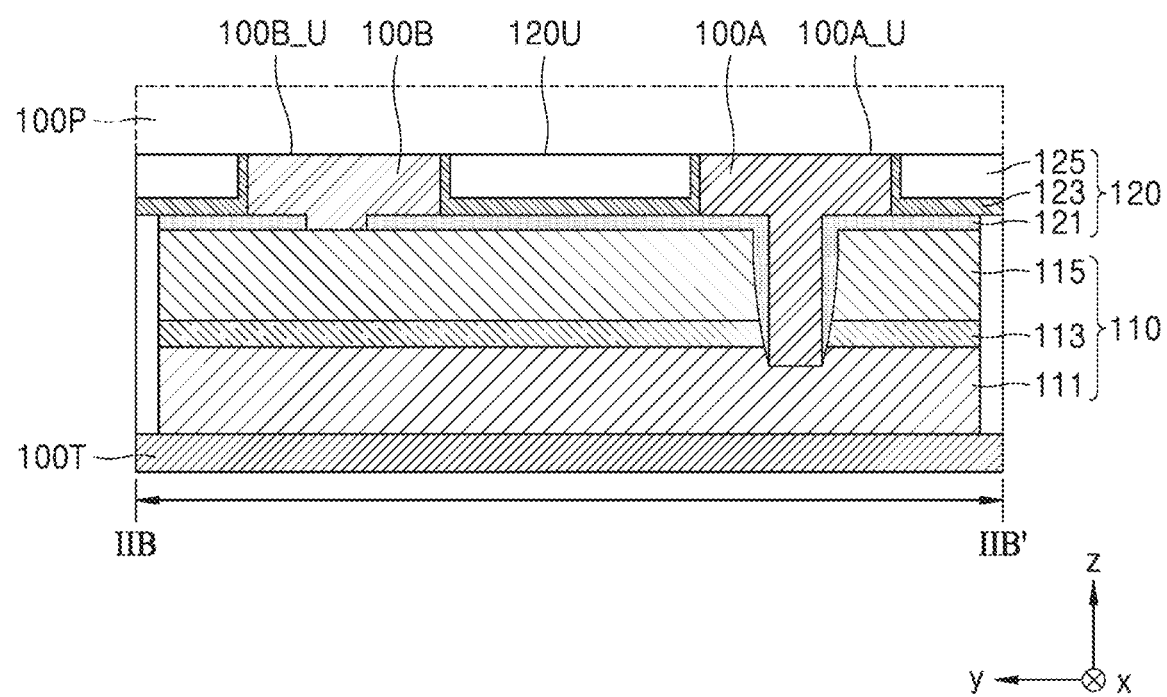

In the light-emitting device 100, the first and second electrodes 100A and 100B may be partially or totally exposed through an insulating layer 120 (refer to FIG. 2B). In some example embodiments, exposed upper surfaces 100A_U and 100B_U of the first and second electrodes 100A and 100B may be on the same plane as (e.g., may be coplanar with) an upper surface 120U of the insulating layer 120 (refer to FIG. 2B). In some example embodiments, the exposed upper surfaces 100A_U and 100B_U of the first and second electrodes 100A and 100B may further protrude to the outside from the insulating layer 120 and thus may be not coplanar with the upper surface 120U of the insulating layer 120 (refer to FIG. 2B).

The heat conductive pad 100T may include a conductive material. The heat conductive pad 100T may include a metal, such as copper (Cu), aluminum (Al), titanium (Ti), tantalum (Ta), tungsten (W), nickel (Ni), or a combination thereof. In some example embodiments, the heat conductive pad 100T may have a paste shape including a metal, a tape shape including a metal, or a plate shape including a metal.

The heat conductive pad 100T may discharge the heat generated in the light-emitting device 100 to the outside. In some example embodiments, the heat conductive pad 100T may be arranged between the lower surface of the light-emitting device 100 and the upper surface of the lead frame LF. That is, the heat conductive pad 100T may transmit the heat generated in the light-emitting device 100 to the lead frame LF.

In order that the heat is discharged to the outside of the light-emitting device package 10 through the heat conductive pad 100T, the lower surface LF_L of the lead frame LF may be exposed to the outside (e.g., the exterior of the light-emitting device package 10) by the lower molding member MB. In other words, the lower molding member MB may not cover the lower surface LF_L of the lead frame LF. In some example embodiments, the heat conductive pad 100T may be bonded to the light-emitting device 100 (e.g., bonded to the lower surface 100L of the light-emitting device 100) and/or the lead frame LF based on a eutectic bonding method. In some example embodiments, the heat conductive pad 100T may be a portion included in the lower surface 100L of the light-emitting device 100, alternatively to being bonded to the lower surface 100L of the light-emitting device 100. In some example embodiments, the lower surface 100L of the light-emitting device 100 may be flat.

The fluorescent material 100P may be arranged in parallel with the first and second electrodes 100A and 100B on the upper surface 100U of the light-emitting device 100. In some example embodiments, the fluorescent material 100P may include a plate type. The fluorescent material 100P may include a resin including a wavelength-converting material. For example, the wavelength-converting material may include a fluorescent material and the resin may include a silicone resin, an epoxy resin, or a resin of a mixture thereof. The fluorescent material 100P may have an electrically insulating property.

The fluorescent material 100P may include at least two types of materials converting light into different wavelengths. In some example embodiments, the fluorescent material 100P may include a material in which green fluorescent powder and red fluorescent power are mixed. In some example embodiments, the fluorescent material 100P may include a structure in which a plurality of wavelength-converting materials are stacked. Accordingly, the fluorescent material 100P may convert the light generated in the light-emitting device 100 into white light or light having a particular (or, alternatively, predetermined) wavelength.

A side surface of the fluorescent material 100P may be on the same plane as (e.g., may be coplanar with) a side surface of the light-emitting device 100. In some example embodiments, as shown in FIGS. 1A-1D, when the light-emitting device package 10 is seen from a planar perspective, only the fluorescent material 100P may be exposed (e.g., exposed to an exterior of the light-emitting device package 10) through the upper molding member MT and the fluorescent material 100P may occupy most of the upper surface area (e.g., surface area of the upper surface 100U) of the light-emitting device 100. That is, as shown in FIGS. 1A-1D, an upper surface 100P_U of the fluorescent material 100P may be exposed to an exterior of the light-emitting device package 10 through the upper molding member MT and the side surface 100P_S of the fluorescent material 100P may not be exposed to the exterior of the light-emitting device package 10 through the upper molding member MT. It will be understood that an element, such that the upper surface 100P_U of the fluorescent material 100P, that is exposed to the exterior of the light-emitting device package 10 may be so exposed such that there is no interposing structure between the element and the exterior of the light-emitting device package 10 (e.g., the upper surface 100P_U may be directly exposed to the exterior of the light-emitting device package 10).

As shown in FIGS. 1A-1D, at least one bonding wire of the bonding wires BW may electrically connect the first electrode 100A to the first electrode frame LF_A, the second electrode 100B to the second electrode frame LF_B, and a Zener diode ZD to the second electrode frame LF_B. Accordingly, as shown in FIGS. 1A-1D, the first electrode frame LF_A and the second electrode frame LF_B are connected through a Zener diode ZD.

Materials of the bonding wires BW may include at least one of gold (Au), silver (Ag), copper (Cu), lead (Pb), tin (Sn), and aluminum (Al). In some example embodiments, the bonding wires BW may be connected based on thermo compression connection or ultrasonic connection and may also be connected based on thermosonic connection in which thermo compression connection and ultrasonic connection are combined. However, materials and connection methods of the bonding wires BW are not limited thereto.

A level of an uppermost surface BW_U of the bonding wires BW (that is, a vertex of a loop height) may be lower than a level of an uppermost surface 100P_U of the fluorescent material 100P. Restated, an upper surface 100P_U of the fluorescent material 100P may be distal from the lower surface 100L of the light-emitting device 100 in relation to an uppermost surface BW_U of the plurality of bonding wires BW. That is, the bonding wires BW may not be exposed through the upper molding member MT.

The Zener diode ZD may be arranged in the first electrode frame LF_A or the second electrode frame LF_B. For example, the Zener diode ZD may be arranged above the first electrode frame LF_A. In this case, the Zener diode ZD and the second electrode frame LF_B may be electrically connected to each other by the bonding wire BW.

The Zener diode ZD may prevent overcurrent in the light-emitting device 100 and/or electrostatic discharge (ESD) of the voltage applied to the light-emitting device 100. In some example embodiments, a bonding layer (not shown) may be arranged between the Zener diode ZD and the first electrode frame LF_A. The bonding layer may bond the Zener diode ZD to the first electrode frame LF_A and may have, for example, a paste shape. In some example embodiments, the light-emitting device package 10 may not include the Zener diode ZD and the bonding layer, and shapes of the light-emitting device package 10 and whether or not the light-emitting device package 10 includes the bonding layer are not limited to the described examples.

The upper molding member MT may be formed above the lower molding member MB and the lead frame LF to surround the light-emitting device 100 and the bonding wires BW. The upper molding member MT may protect the light-emitting device 100 by surrounding the light-emitting device 100. In some example embodiments, the upper molding member MT may include a fluorescent material configured to change a wavelength of the light emitted from the light-emitting device 100.

A side surface MT_S and an upper surface MT_U of the upper molding member MT may have a rectangular shape. The upper molding member MT may protect the light-emitting device 100 from external effects, such as contamination, shocks, etc. In order to perform this function, the upper molding member MT may have a thickness at least to completely surround the light-emitting device 100. The upper molding member MT may completely cover the lower molding member MB, and a width and a breadth of the upper molding member MT may be substantially the same (e.g., the same within manufacturing tolerances and/or material tolerances) as a width and a breadth of the lower molding member MB.

The upper molding member MT may protect the bonding wires BW. In some example embodiments illustrated in the drawings, the bonding wires MB are arranged only in the upper molding member MT, while not being arranged in the lower molding member MB. However, based on a design, each of the bonding wires BW may be arranged to extend to the lower molding member MB.

The upper molding member MT may include a different material from the lower molding member MB. The upper molding member MT may include a different total material composition from a total material composition of the lower molding member MB. For example, the lower molding member MB may include white silicone and the upper molding member MT may include clear silicone, but they are not limited thereto.

The side surface MT_S of the upper molding member MT may be on the same plane as (e.g., may be coplanar with) the side surface MB_S of the lower molding member MB. The upper molding member MT may be formed by using a transfer molding method.

The light-emitting device package 10 according to the inventive concepts may increase the efficiency of extracting the light emitted from the light-emitting device 100 by using the fluorescent material 100P exposed from the upper molding member MT and may also effectively enhance the heat resistance efficiency thereof by discharging the heat generated in the light-emitting device 100 to the outside (e.g., exterior) of the light-emitting device package 10 through the heat conductive pad 100T and the lead frame LF.

Ultimately, because the light-emitting device package 10 according to the inventive concepts includes the light-emitting device 100 that is stably supported and fixed by the lead frame LF and has excellent heat radiation, the reliability and the economic feasibility of a product including the light-emitting device package 10 may be increased.

FIGS. 2A and 2B are views of the light-emitting device 100 included in the light-emitting device package 10 according to some example embodiments of the inventive concepts.

In detail, FIG. 2A is a perspective view of the light-emitting device 100 and FIG. 2B is a cross-sectional view of the light-emitting device 100 taken along line IIB-IIB' of FIG. 2A.

Referring to FIGS. 2A and 2B together, the light-emitting device 100 may include a light-emitting structure 110 that includes a sequential stack of a first conductivity-type semiconductor layer 111, an active layer 113, and a second conductivity-type semiconductor layer 115.

The first conductivity-type semiconductor layer 111 and the second conductive-type semiconductor layer 115 may include a semiconductor doped with p type impurities and a semiconductor doped with n type impurities, respectively. In some example embodiments, the first conductivity-type semiconductor layer 111 and the second conductivity-type semiconductor layer 115 may include a semiconductor doped with n type impurities and a semiconductor doped with p type impurities, respectively.

The first and second conductivity-types semiconductor layers 111 and 115 may include nitride semiconductors, for example, $Al_xIn_yGa_{(1-x-y)}N(0<x<1, 0<y<1, 0<x+y<1)$. However, the first and second conductivity-types semiconductor layers 111 and 115 may also include GaAs-based semiconductors or GaP-based semiconductors, in addition to the nitride semiconductors. In some example embodiments, the first conductivity-type semiconductor layer 111, the active layer 113, and the second conductivity-type semiconductor layer 115 may be epitaxial layers.

The active layer 113 between the first and second conductivity-types semiconductor layers 111 and 115 may emit light having certain energy via recombination of electrons and holes. In some example embodiments, the active layer 113 may include a multi-quantum well structure in which quantum well layers and quantum barrier layers are alternately stacked. For example, the active layer 113 may include a InGaN/GaN structure or a AlGaN/GaN structure. In some example embodiments, the active layer 113 may include a single quantum well structure.

The light-emitting device 100 may emit blue light, green light, red light, infrared (IR) light, ultraviolet (UV) light, etc. based on a compound semiconductor material of the light-emitting structure 110. However, due to the fluorescent material 100P formed on the light-emitting device 100, a wavelength of the light emitted from the light-emitting structure 110 may be changed so that light of various colors may be output.

The light-emitting structure 110 may be electrically connected to the first and second electrodes 100A and 100B. In detail, the first and second conductivity-types semiconductor layers 111 and 115 may be connected to the first and second electrodes 100A and 100B, respectively.

The first electrode 100A may penetrate the second conductivity-type semiconductor layer 115 and the active layer 113 and connect to the first conductivity-type semiconductor layer 111, such that the first electrode 100A is connected to the first conductivity-type semiconductor layer 111 through the insulating layer 120, the second conductivity-type semiconductor layer 115, and the active layer 113. As shown in FIGS. 2A-2B, a plurality of insulating layers 120 may be formed on an outer side wall of the first electrode 100A and an upper surface of the second conductivity-type semiconductor layer 115 to prevent electrical connection between the first electrode 100A and the active layer 113, the plurality of insulating layers 120 including first through third insulating layers 121, 123, and 125. The first electrode 100A may be electrically connected to the bonding wires BW (refer to FIG. 1A).

In some example embodiments, the second electrode 100B may penetrate the first insulating layer 121 formed on the upper surface of the second conductivity-type semiconductor layer 115 and connect to the second conductivity-type semiconductor layer 115, such that the second electrode 100B is connected to the second conductivity-type semiconductor layer 115 through the insulating layer 120. The second electrode 100B may be electrically connected to the bonding wires BW (refer to FIG. 1A).

The first conductivity-type semiconductor layer 111, the active layer 113, the second conductivity-type semiconductor layer 115, and the plurality of insulating layers 120 are described to provide an example of the light-emitting device 100, and the light-emitting device 100 is not limited thereto. In some example embodiments, the described electrical connection structure between the light-emitting structure 110 and the first and second electrodes 100A and 100B is an example, and the electrical connection structure is not limited thereto.

An upper surface 100A_U of the first electrode 100A may be on substantially the same level as (e.g., may be coplanar with) an upper surface 100B_U of the second electrode 100B. As shown in FIGS. 2A-2B, the upper surface 100A_U of the first electrode 100A, the upper surface 100B_U of the second electrode 100B, and the lower surface 100P_U of the fluorescent material 100P may be coplanar with each other. It will be understood that elements that are described herein to be coplanar with each other may be substantially coplanar with each other, where substantially coplanar elements are coplanar with each other within manufacturing tolerances and/or material tolerances. In some example embodiments, and as shown in FIG. 2A, when the light-emitting device 100 is seen from a planar perspective, a longitudinal axis 100A_1 of the first electrode 100A and a longitudinal axis 100B_1 of the second electrode 100B may extend in parallel with each other and with (e.g., along) the edge 100_E of the light-emitting device 100. In some example embodiments, the first and second electrodes 100A and 100B may be on the upper surface of the light-emitting device 100, like the fluorescent material 100P. Unlike the first and second electrodes 100A and 100B, the heat conductive pad 100T may be on the lower surface of the light-emitting device 100.

Figure 3A:
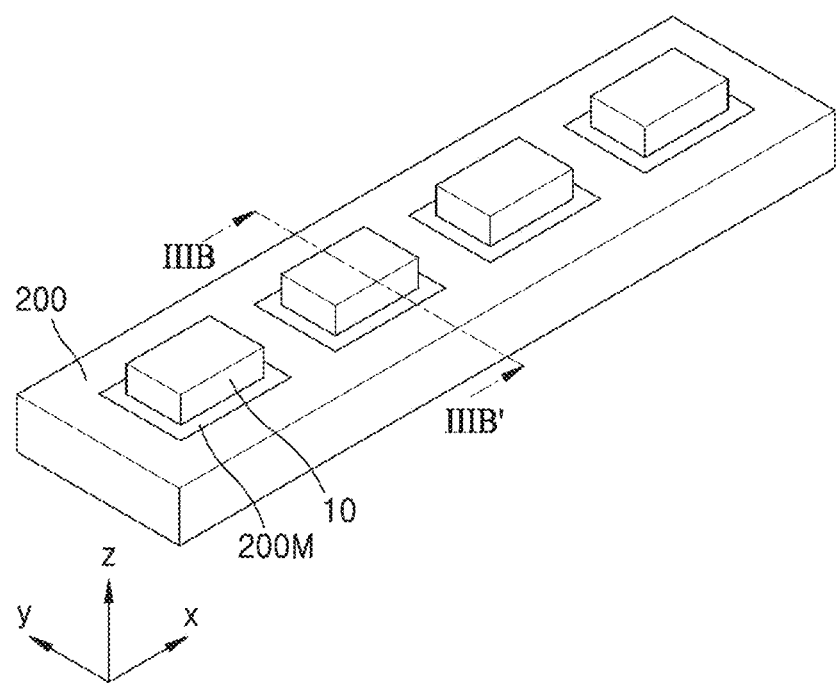
FIGS. 3A and 3B are views of a shape in which a light-emitting device package is mounted on a circuit substrate, according to some example embodiments of the inventive concepts.
Figure 3B:
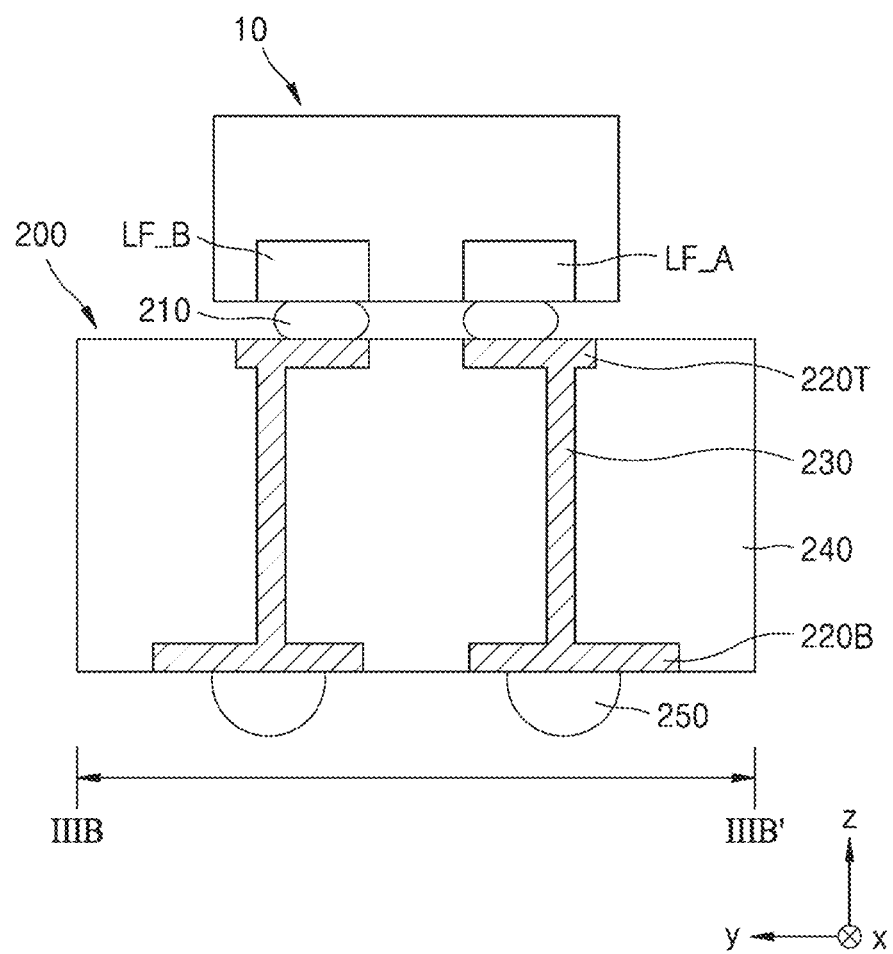

FIGS. 3A and 3B are views of a shape in which the light-emitting device package 10 is mounted on a circuit substrate 200, according to some example embodiments of the inventive concepts.

In detail, FIG. 3A is a perspective view showing a shape in which a plurality of light-emitting device packages 10 are mounted on the circuit substrate 200 and FIG. 3B is a cross-sectional view taken along line IIIB-IIIB' of FIG. 3A.

Referring to FIGS. 3A and 3B together, the light-emitting device packages 10 may be mounted in mounting areas 200M defined on an upper surface of the circuit substrate 200.

The plurality of light-emitting device packages 10 may be provided and may be arranged in series with each other on the upper surface of the circuit substrate 200 to be apart from each other by a certain distance. In some example embodiments, the plurality of light-emitting device packages 10 may be arranged in a plurality of rows. In some example embodiments, the plurality of light-emitting device packages 10 may be arranged in a linear shape or a curved shape or in a certain pattern.

The light-emitting device packages 10 may be electrically connected to an upper connection pad 220T provided on the circuit substrate 200 through the first and second electrode frames LF_A and LF_B. The light-emitting device packages 10 may emit light having a certain wavelength based on driving power applied from the outside.

Detailed aspects of the light-emitting device packages 10 are as described above. Depending on the light-emitting structure 110 (refer to FIG. 2A) or the fluorescent material 100P (refer to FIG. 2A) included in the light-emitting device packages 10, the light-emitting device packages 10 may emit blue light, green light, or red light, and may also emit white light, UV rays, etc.

In the drawing, one light-emitting device package 10 is mounted in each of the mounting areas 200M. However, the inventive concepts is not limited thereto, and a plurality of light-emitting device packages 10 may be mounted in each of the mounting areas 200M. Alternatively, all of the light-emitting device packages 10 may be mounted in one mounting area 200M.

The upper connection pad 220T and the first and second electrode frames LF_A and LF_B of the light-emitting device package 10 may be mounted on the upper surface of the circuit substrate 200 such that the upper connection pad 220T and each of the first and second electrode frames LF_A and LF_B are electrically connected to each other through a first connection member 210. In some example embodiments, a second connection member 250 may be formed on a lower connection pad 220B on a lower surface of the circuit substrate 200.

The light-emitting device packages 10 may be mounted on the circuit substrate 200 and electrically connected to the circuit substrate 200 via the first connection member 210, for example, a solder ball or a solder bump (hereinafter, commonly referred to as the solder ball). That is, the light-emitting device packages 10 may be bonded to the circuit substrate 200 based on a solder joint bonding method.

Referring to a cross-section of the circuit substrate 200, the circuit substrate 200 may include a double-faced printed circuit substrate in which the upper connection pad 200T over the via 230 overlaps a via 230 and the lower connection pad 220B under the via 230 and at which the second connection member 250 is located overlaps the via 230.

In detail, the circuit substrate 200 may have the structure in which the lower connection pad 220B, the via 230, and the upper connection pad 220T are sequentially stacked. The upper connection pad 220T and the lower connection pad 220B may be electrically connected to each other through the via 230. In some example embodiments, each of the upper connection pad 220T and the lower connection pad 220B may be covered by a body portion 240, with only a connection portion of the upper connection pad 220T and the lower connection pad 220B being exposed. The exposed area of the upper connection pad 220T may be an area to which the first connection member 210, such as a solder ball, is bonded, after the area is surface-processed, and the exposed area of the lower connection pad 220B may be an area to which the second connection member 250, such as a solder ball, is bonded, after the area is surface-processed.

The size of the first connection member 210 may be less than the size of the second connection member 250. Thus, the exposed area of the upper connection pad 220T may be less than the exposed area of the lower connection pad 220B. With reference to the drawing, the circuit substrate 200 including two metal layers is described as an example. However, the number of metal layers may be three or more according to necessity to form a relatively more complex structure.

The light-emitting device packages 10 according to the inventive concepts may be mounted on the circuit substrate 200 through the first connection member 210 bonded to each of the first and second electrode frames LF_A and LF_B. Thus, coefficients of thermal expansion of materials of the first and second electrode frames LF_A and LF_B, the first connection member 210, and the circuit substrate 200 may not be greatly different from one another, and thus, defects, such as cracks in the light-emitting device packages 10, may be significantly reduced.

Consequently, the light-emitting device packages 10 according to the inventive concepts may have excellent bonding characteristics with respect to the circuit substrate 200 by using the first and second electrode frames LF_A and LF_B, and thus, the reliability and the economic feasibility of a product may be enhanced.

Figure 4A:
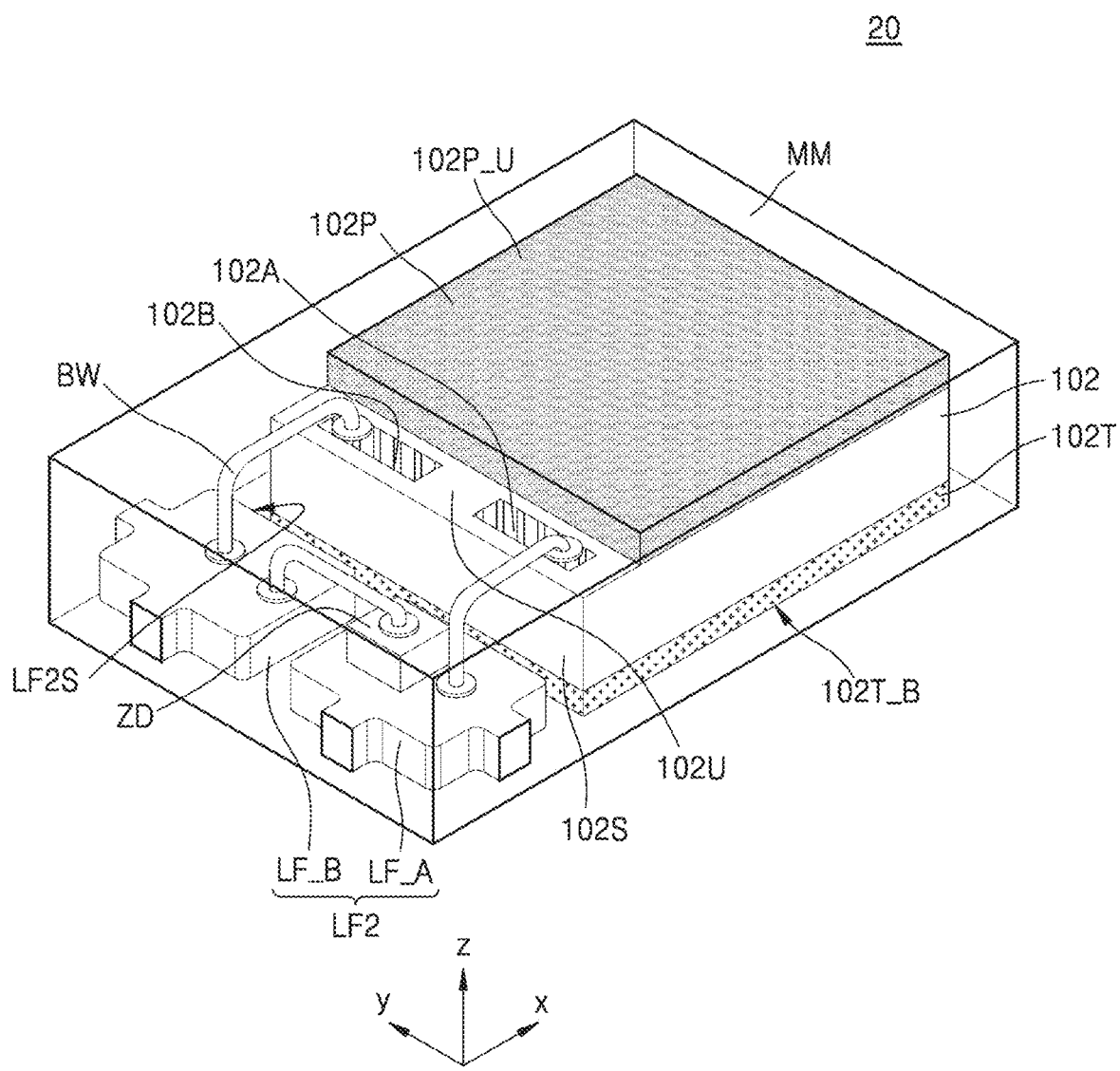
FIGS. 4A and 4B are views of a light-emitting device package according to some example embodiments of the inventive concepts.
Figure 4B:
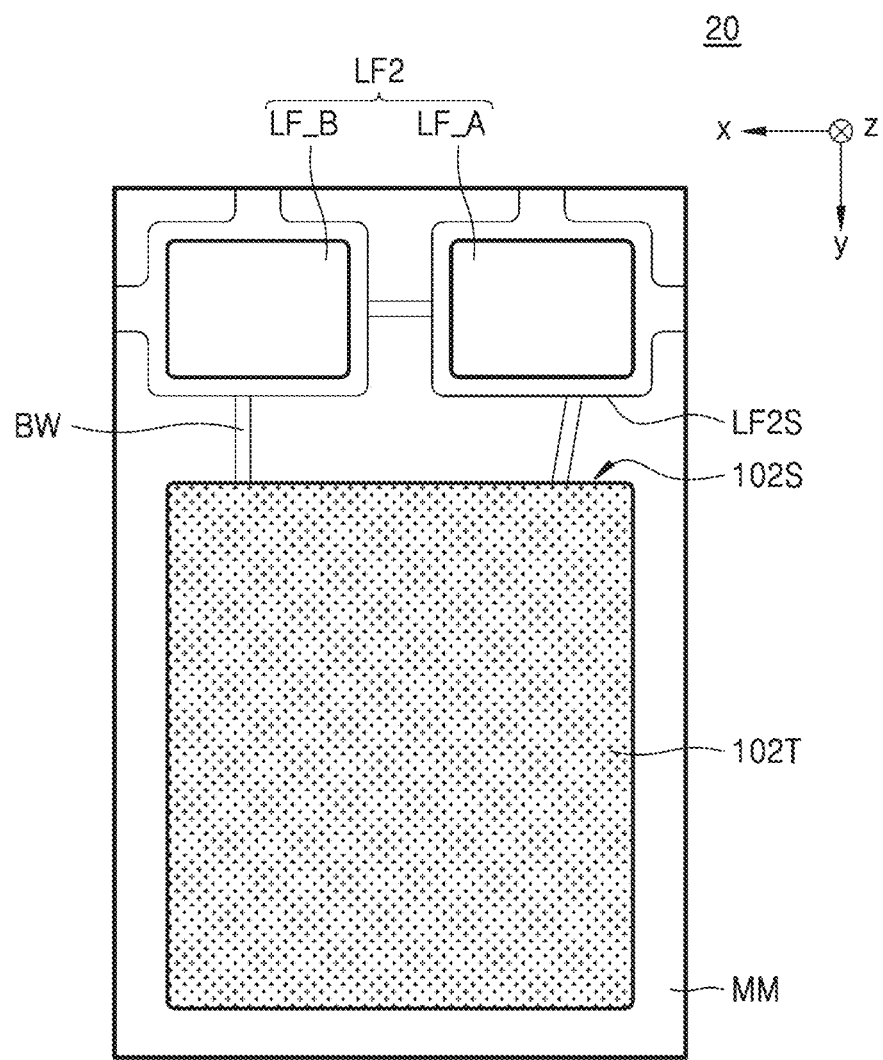

FIGS. 4A and 4B are views of a light-emitting device package 20 according to some example embodiments of the inventive concepts.

Most of the components included in the light-emitting device package 20 and materials of those components described hereinafter are the same or substantially the same as described above in FIGS. 1A through 1D. Thus, for convenience of explanation, descriptions will be given by focusing on differences from the light-emitting device package 10 (refer to FIG. 1A) described above.

In detail, FIG. 4A is a perspective view of the light-emitting device package 20 and FIG. 4B is a bottom view of the light-emitting device package 20. In some example embodiments, for convenience of explanation, a molding member MM is illustrated to be transparent.

Referring to FIGS. 4A and 4B together, the light-emitting device package 20 may include a lead frame LF2 (also referred to herein as a package substrate) including a first electrode frame LF_A and a second electrode frame LF_B, a light-emitting device 102, which is arranged to be adjacent to the lead frame LF2 with a side surface 102S of the light-emitting device 102 facing a side surface LF2_S of the lead frame LF2 and which has a lower surface on which a heat conductive pad 102T is formed, a first electrode 102A on an upper surface 102U of the light-emitting device 102, a second electrode 102B on the upper surface 102U of the light-emitting device 102, and a fluorescent material 102P on the upper surface 102U of the light-emitting device 102, bonding wires BW electrically connecting the first electrode frame LF_A with the first electrode 102A and electrically connecting the second electrode frame LF_B with the second electrode 102B, and the molding member MM surrounding both the lead frame LF2 and the light-emitting device 102.

As shown in FIGS. 4A and 4B, an upper surface of the first electrode 102A, an upper surface of the second electrode 102B, and a lower surface of the fluorescent material 102P may be coplanar with each other. Still referring to FIGS. 4A and 4B, a lower surface of the lead frame LF2 may be coplanar with the lower surface of the light-emitting device 102.

The lead frame LF2 may include the first electrode frame LF_A connected with the first electrode 102A via the bonding wire BW and the second electrode frame LF_B connected with the second electrode 102B via the bonding wire BW.

That is, the lead frame LF2 included in the light-emitting device package 20 may not include the main frame LF_M (refer to FIG. 1A), unlike the light-emitting device package 10 (refer to FIG. 1A) described above.

The molding member MM may be formed around the lead frame LF2 and the light-emitting device 102 to surround the lead frame LF2 and the light-emitting device 102. The lead frame LF2 may be separated into the first electrode frame LF_A and the second electrode frame LF_B by the molding member MM. In other words, the lead frame LF2 may be separated into the portions electrically insulated from each another by the molding member MM.

In some example embodiments, the molding member MM may be formed to surround the light-emitting device 102 and the bonding wires BW. The molding member MM may protect the light-emitting device 102 by surrounding the light-emitting device 102. In some example embodiments, the molding member MM may include a fluorescent material to change a wavelength of the light emitted from the light-emitting device 102.

A side surface and an upper surface of the molding member MM may have a rectangular shape. The molding member MM may protect the light-emitting device 102 from external effects, such as contamination, shocks, etc. In order to perform this function, the molding member MM may have a thickness at least to completely surround the light-emitting device 102. In some example embodiments, the molding member MM may protect the bonding wires BW.

That is, the molding member MM included in the light-emitting device package 20 may be integrally provided, unlike the light-emitting device package 10 (refer to FIG. 1A) described above.

The heat conductive pad 102T may discharge the heat generated in the light-emitting device 102 to the outside. To this end, a lower surface 102T_B of the heat conductive pad 102T may be formed to be exposed to an exterior of the light-emitting device package 20 through the molding member MM. In other words, the molding member MM may not cover the lower surface 102T_B of the heat conductive pad 102T. The heat conductive pad 102T may include a conductive material. The heat conductive pad 102T may include a metal material. The material of the heat conductive pad 102T may include, for example, Au or a metal including Au. Thus, the heat conductive pad 102T may be referred to as a heat conductive material layer or Au finish, in the light-emitting device package 20.

That is, the heat conductive pad 102T included in the light-emitting device package 20 may not be formed to contact the main frame LF_M (refer to FIG. 1A), unlike the light-emitting device package 10 (refer to FIG. 1A) described above.

Still referring to FIGS. 4A and 4B, an upper surface 102P_U of the fluorescent material may be exposed to an exterior of the light-emitting device package 20 through the molding member MM.

Figure 5A:
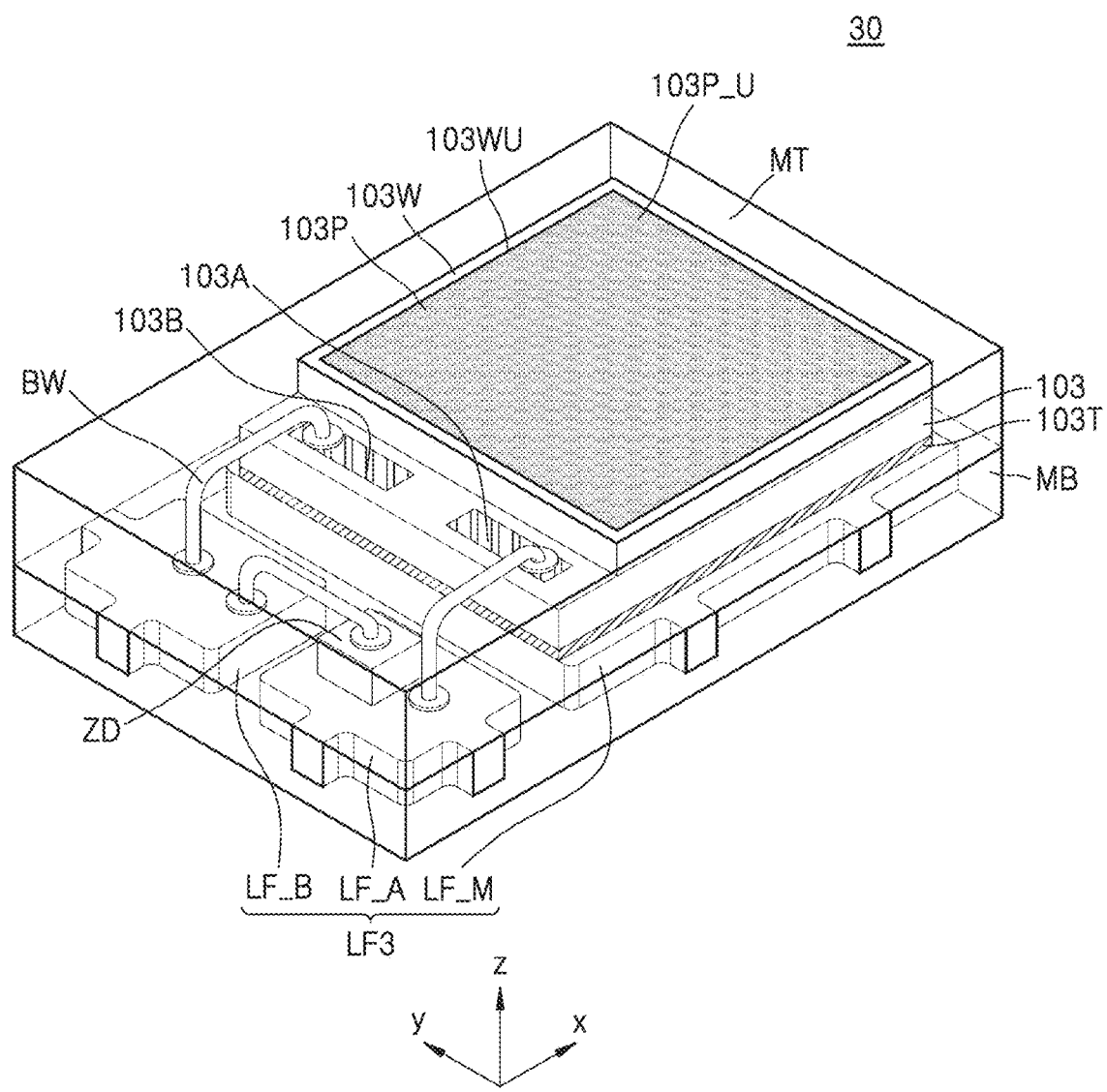
FIGS. 5A and 5B are views of a light-emitting device package according to some example embodiments of the inventive concepts.
Figure 5B:
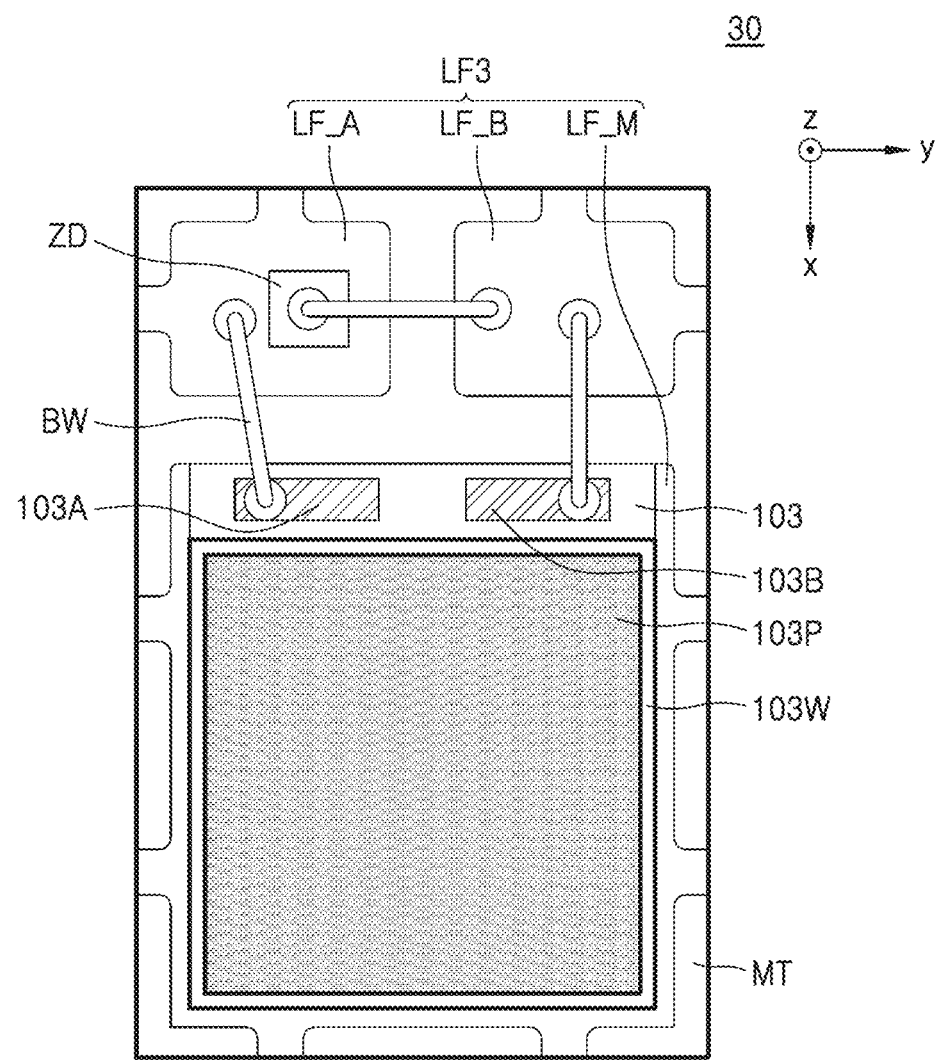

FIGS. 5A and 5B are views of a light-emitting device package 30 according to some example embodiments of the inventive concepts.

Most of the components included in the light-emitting device package 30 and materials of those components described hereinafter are the same or substantially the same as described above in FIGS. 1A through 1D. Thus, for convenience of explanation, descriptions will be given by focusing on differences from the light-emitting device package 10 (refer to FIG. 1A) described above.

In detail, FIG. 5A is a perspective view of the light-emitting device package 30 and FIG. 5B is a bottom view of the light-emitting device package 30. In some example embodiments, for convenience of explanation, an upper molding member MT and a lower molding member MB are illustrated to be transparent.

Referring to FIGS. 5A through 5B together, the light-emitting device package 30 may include a lead frame LF3 surrounded by the lower molding member MB, a light-emitting device 103 surrounded by the upper molding member MT and arranged above the lead frame LF3, a heat conductive pad 103T arranged between a lower surface of the light-emitting device 103 and an upper surface of the lead frame LF3, a first electrode 103A, a second electrode 103B, and a fluorescent material 103P arranged on an upper surface of the light-emitting device 103, a partition structure 103W covering one or more, or all, side walls of the fluorescent material 103P and having an upper surface 103WU at the same level as (e.g., coplanar with) an upper surface 103P_U of the fluorescent material 103P, and bonding wires BW electrically connecting each of the first electrode 103A and the second electrode 103B with the lead frame LF3.

The light-emitting device package 30 is substantially the same as the light-emitting device package 10 (refer to FIG. 1A) described above, except that the light-emitting device package 30 further includes the partition structure 103W.

The partition structure 103W may lock the fluorescent material 103P arranged above the light-emitting device 103. That is, the fluorescent material 103P may be arranged in a cavity formed by the upper surface of the light-emitting device 103 and the partition structure 103W. A contrast of the light emitted from the light-emitting device 103 may be improved by forming the partition structure 103W around the fluorescent material 103P.

The partition structure 103W may include Si and the fluorescent material 103P may be formed based on a dispensing method filling the cavity formed by the partition structure 103W. An upper surface of the partition structure 103W and an upper surface of the fluorescent material 103P may be exposed through the upper molding member MT and a side surface of the partition structure 103W may not be exposed through the upper molding member MT.

Figure 6:
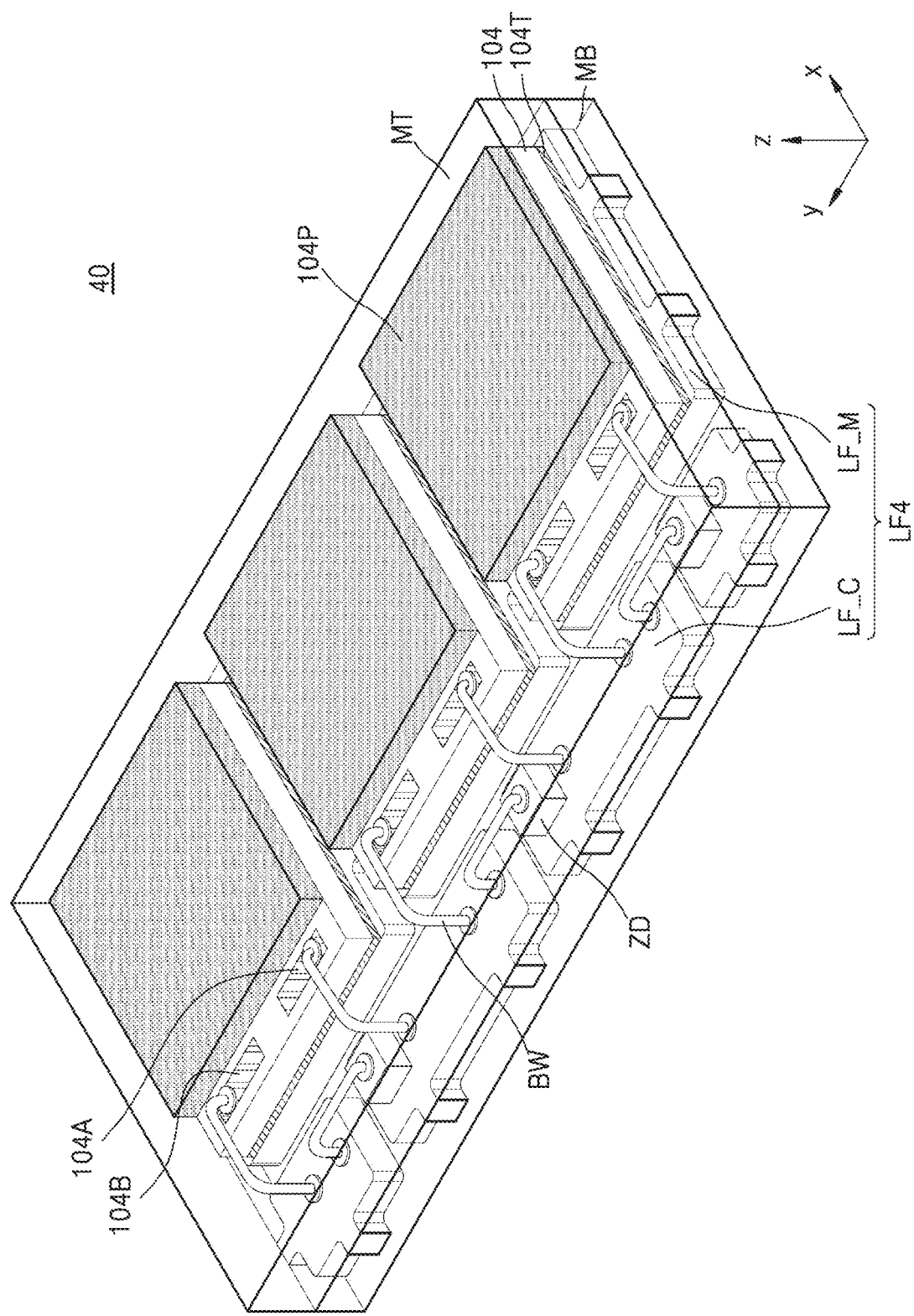
FIG. 6 is a perspective view of a light-emitting device package according to some example embodiments of the inventive concepts.

FIG. 6 is a perspective view of a light-emitting device package 40 according to some example embodiments of the inventive concepts.

Most of the components included in the light-emitting device package 40 and materials of those components described hereinafter are the same or substantially the same as described above in FIGS. 1A through 1D. Thus, for convenience of explanation, descriptions will be given by focusing on differences from the light-emitting device package 10 (refer to FIG. 1A) described above.

Referring to FIG. 6, the light-emitting device package 40 may include a lead frame LF4 (also referred to herein as a package substrate) surrounded by a lower molding member MB, a plurality of light-emitting devices 104 surrounded by an upper molding member MT and arranged on (e.g., above) the lead frame LF4, a heat conductive pad 104T arranged between a lower surface of each light-emitting device 104 of the plurality of light-emitting devices 104 and an upper surface of the lead frame LF4, a separate first electrode 104A on an upper surface of each light-emitting device 104 of the plurality of light-emitting devices 104, a separate second electrode 104B on an upper surface of each light-emitting device 104 of the plurality of light-emitting devices 104, and a separate fluorescent material 104P on an upper surface of each light-emitting device 104 of the plurality of light-emitting devices 104, and bonding wires BW electrically connecting each electrode of the first electrode 104A and the second electrode 104B with the lead frame LF4.

The lead frame LF4 may include a main frame LF_M in which the light-emitting devices 104 are arranged (e.g., the light-emitting devices 104 are on the main frame LF_M) and an electrode frame LF_C connected to each of the first and second electrodes 104A and 104B via the bonding wires BW (e.g., a plurality of electrode frames LF_C).

The main frame LF_M and the electrode frame LF_C may be physically separated from each other by the lower molding member MB. The plurality of light-emitting devices 104 may be mounted in the main frame LF_M, and the main frame LF_M may discharge the heat generated in the plurality of light-emitting devices 104 to the outside. In some example embodiments, the electrode frame LF_C may provide power to the plurality of light-emitting devices 104.

The main frame LF_M may be arranged below the plurality of light-emitting devices 104, and the electrode frame LF_C may be arranged in parallel with the main frame LF_M at a side surface of the main frame LF_M. The area of the main frame LF_M may be greater than that of the electrode frame LF_C. In some example embodiments, the main frame LF_M and the electrode frame LF_C may be provided as separate components. In some example embodiments, the main frame LF_M and the electrode frame LF_C may be integrally provided.

The bonding wires BW may electrically connect each of the first and second electrodes 104A and 104B to the electrode frame LF_C. A Zener diode ZD may be arranged in the electrode frame LF_C. The electrode frame LF_C in which the Zener diode ZD is arranged and an electrode frame LF_C adjacent to the electrode frame LF_C in which the Zener diode ZD is arranged may be electrically connected to each other via the bonding wire BW.

That is, as shown in FIG. 6, in the light-emitting device package 40, adjacent light-emitting devices 104 from among the plurality of light-emitting devices 104 may be electrically connected to via separate, respective individual bonding wires BW, and thus share, one electrode frame LF_C.

As shown in FIG. 6, a side surface of the upper molding member MT may be coplanar with a side surface of the lower molding member MB. As further shown in FIG. 6, an upper surface of each fluorescent material 104P of each light-emitting device 104 is exposed to an exterior of the light-emitting device package 40 through the upper molding member MT. As shown in FIG. 6, an upper surface of the first electrode 104A, an upper surface of the second electrode 104B, and a lower surface of the fluorescent material 104P of each light-emitting device 104 of the plurality of light-emitting devices 104 are coplanar with each other.

Figure 7:
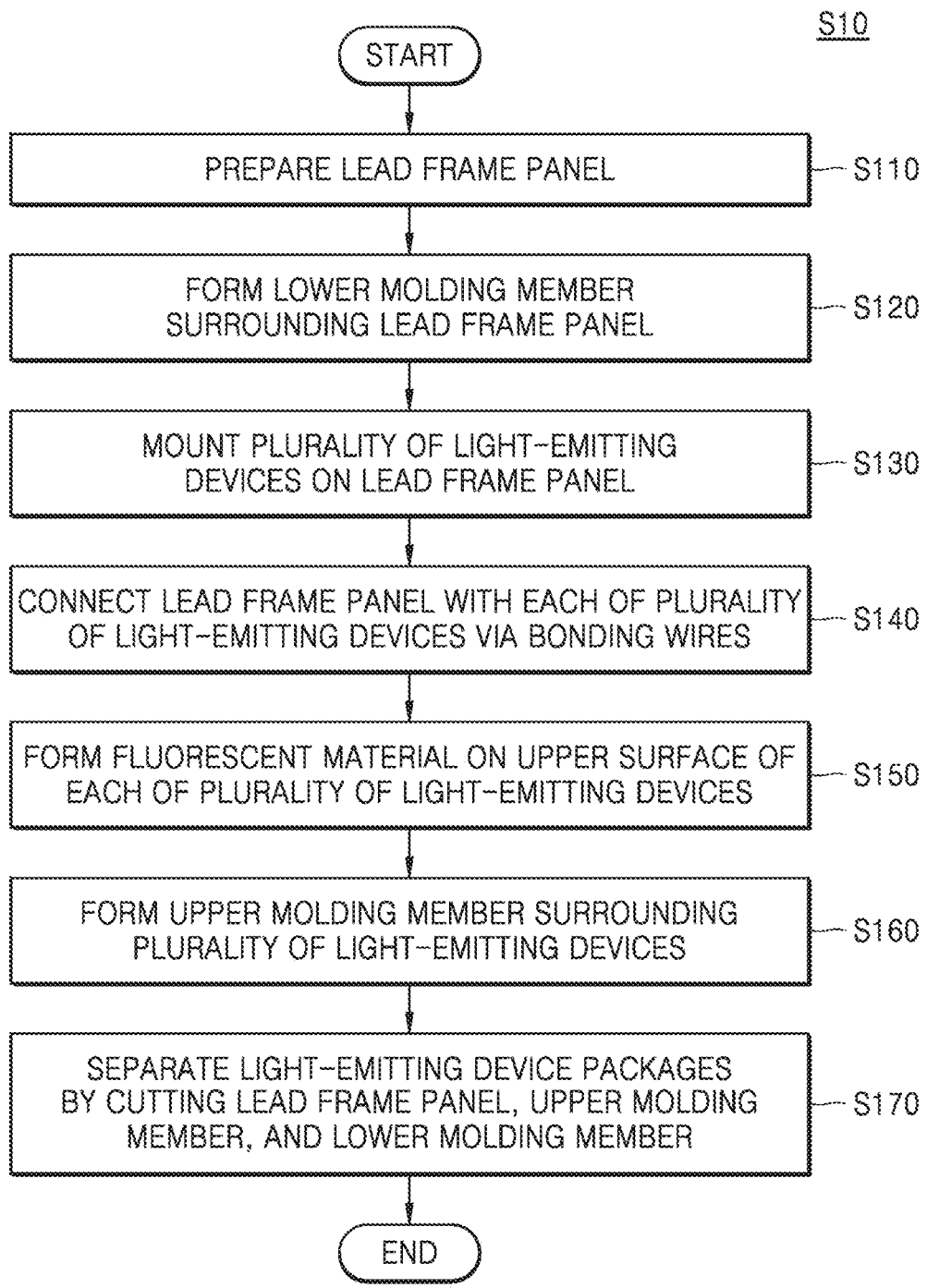
FIG. 7 is a block diagram for describing a method of manufacturing a light-emitting device package, according to some example embodiments of the inventive concepts.

FIG. 7 is a block diagram for describing a method of manufacturing a light-emitting device package, according to some example embodiments of the inventive concepts.

Referring to FIG. 7, the method (S10) of manufacturing the light-emitting device package may include the processes having the order described below. When some example embodiments may be implemented differently, a specific process order may be performed differently from the described order. For example, two consecutively described processes may be performed substantially at the same time or performed in an order opposite to the described order.

The method (S10) of manufacturing the light-emitting device package according to the inventive concepts may include a first operation (S110) of preparing a lead frame panel, a second operation (S120) of forming a lower molding member surrounding the lead frame panel, a third operation (S130) of mounting a plurality of light-emitting devices on the lead frame panel, a fourth operation (S140) of connecting the lead frame panel to each of the plurality of light-emitting devices via bonding wires, a fifth operation (S150) of forming a fluorescent material on an upper surface of each of the plurality of light-emitting devices, a sixth operation (S160) of forming an upper molding member surrounding the plurality of light-emitting devices, and a seventh operation (S170) of cutting the lead frame panel, the upper molding member, and the lower molding member to form separate light-emitting device packages.

Technical aspects of each of the first through seventh operations (S110 through S170) will be described in detail with reference to FIGS. 8A through 8I below.

FIGS. 8A, 8B, 8C, 8D, 8E, 8F, 8G, 8H, and 8I are views for sequentially describing a method of manufacturing a light-emitting device package, according to some example embodiments of the inventive concepts.

Figure 8A:
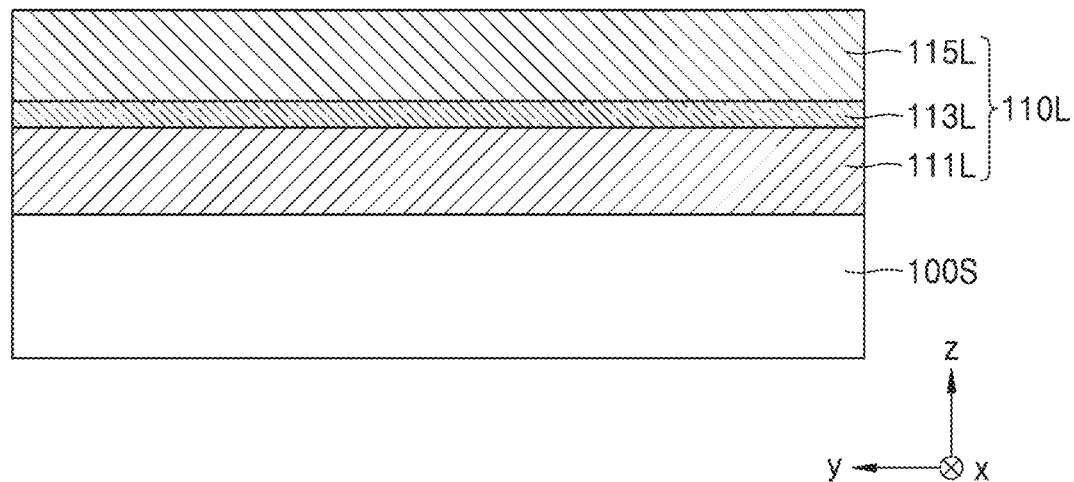
FIGS. 8A, 8B, 8C, 8D, 8E, 8F, 8G, 8H, and 8I are views for sequentially describing a method of manufacturing a light-emitting device package, according to some example embodiments of the inventive concepts.

Referring to FIG. 8A, a light-emitting structure layer 110L may be formed above a supporting substrate 100S. A first material layer 111L for a first conductivity-type semiconductor layer, a second material layer 113L for an active layer, and a third material layer 115L for a second conductivity-type semiconductor layer may be sequentially formed above the supporting substrate 100S.

The first and third material layers 111L and 115L may include nitride semiconductors, for example, $Al_xIn_yGa_{(1-x-y)}N(0 \leq x<1, 0 \leq y<1, 0 \leq x+y<1)$. However, the first and third material layers 111L and 115L may also include GaAs-based semiconductors or GaP-based semiconductors, in addition to the nitride semiconductors.

The second material layer 113L may include a multi-quantum well structure in which quantum well layers and quantum barrier layers are alternately stacked, for example, a InGaN/GaN structure or a AlGaN/GaN structure. In some example embodiments, the second material layer 113L may include a single quantum well structure.

Figure 8B:
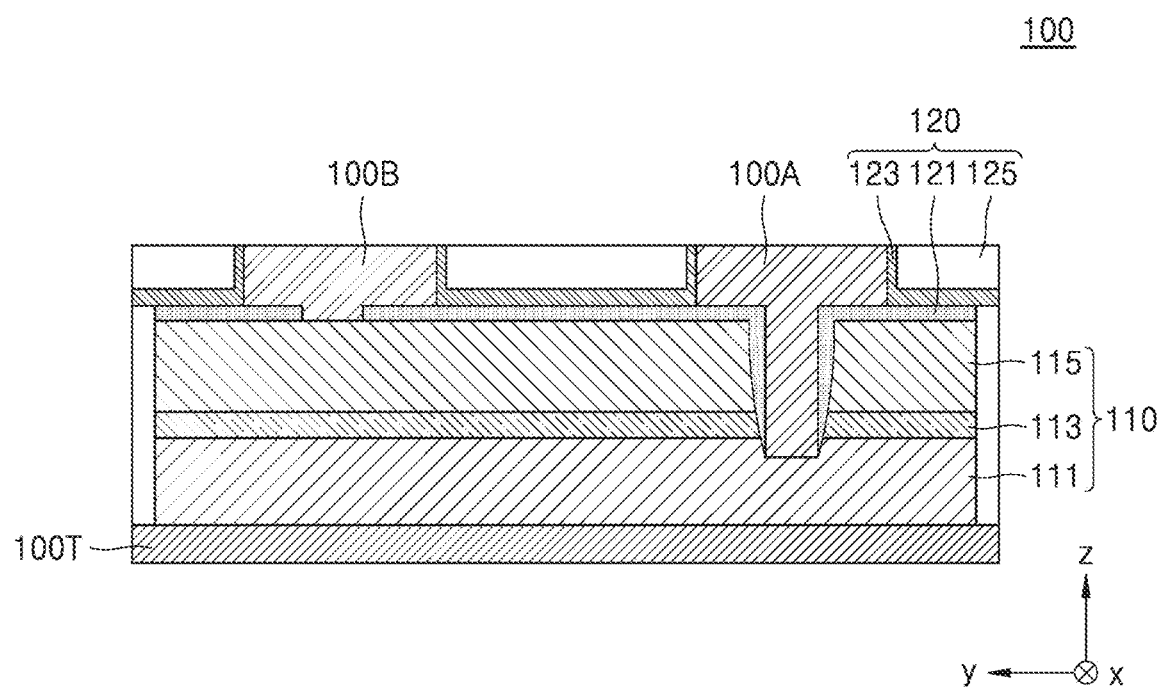

Referring to FIG. 8B, the light-emitting device 100 including the light-emitting structure 110 may be formed by patterning the light-emitting structure layer 110L (refer to FIG. 8A) based on a photo process and an etch process.

The light-emitting device 100 may emit blue light, green light, red light, UV rays, etc. based on a compound semiconductor material of the light-emitting structure 110. The light-emitting device 100 may be provided in a multiple number.

The light-emitting structure 110 may be electrically connected to the first and second electrodes 100A and 100B. In detail, the first electrode 100A may penetrate the second conductivity-type semiconductor layer 115 and the active layer 113 and connect to the first conductivity-type semiconductor layer 111. The plurality of insulating layers 120 may be formed on an outer side wall of the first electrode 100A and an upper surface of the second conductivity-type semiconductor layer 115 to prevent direct electrical connection between the first electrode 100A and the active layer 113. In some example embodiments, the second electrode 100B may penetrate the first insulating layer 121 formed on the upper surface of the second conductivity-type semiconductor layer 115 and connect to the second conductivity-type semiconductor layer 115.

Figure 8C:
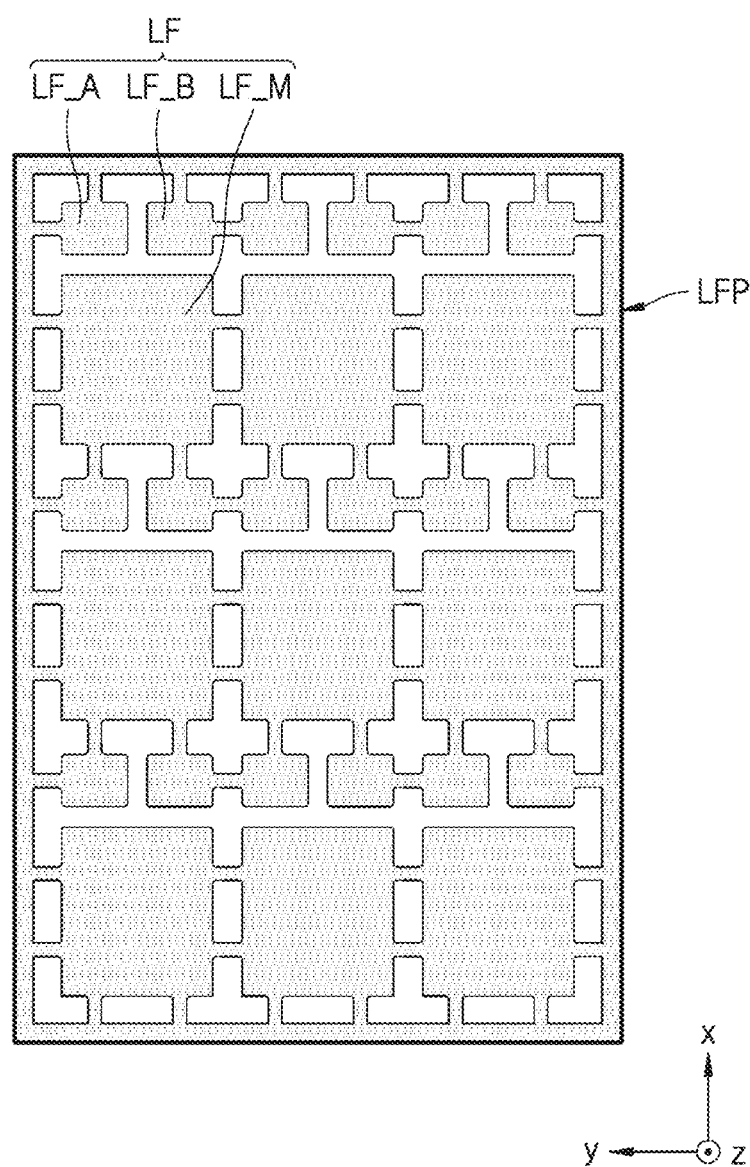

Referring to FIG. 8C, a lead frame panel LFP including a plurality of lead frames LF having a certain shape may be manufactured.

The lead frames LF may be formed based on an injection molding method.

Alternatively, the lead frame panel LFP may be formed to include a plurality of lead frame patterns by forming Cu in a shape of a plate and then etching and/or stamping the shape of the plate.

Each of the plurality of lead frames LF may include a main frame LF_M in which the light-emitting device 100 (refer to FIG. 8B) is to be arranged, a first electrode frame LF_A to be electrically connected to the first electrode 100A (refer to FIG. 8B), and a second electrode frame LF_B to be electrically connected to the second electrode 100B (refer to FIG. 8B).

Figure 8D:
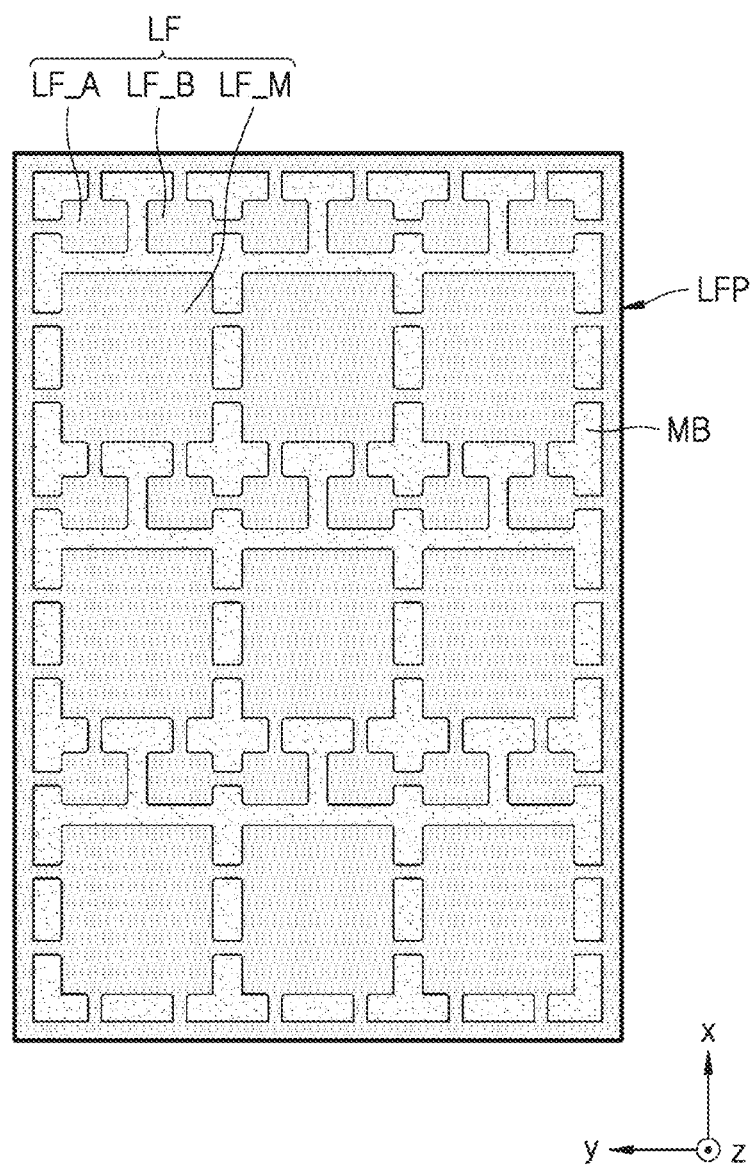

Referring to FIG. 8D, the lower molding member MB may be formed by molding a lower molding material in the lead frame panel LFP.

The lower molding member MB may be formed to fill an empty space of the lead frame panel LFP and surround the plurality of lead frames LF.

The lower molding member MB may include, for example, an epoxy molding compound. In some example embodiments, the lower molding member MB is not limited to the epoxy molding compound, and may include various materials, such as an epoxy-based material, a thermosetting material, a thermoplastic material, a UV processing material, etc.

An upper surface and a lower surface of the lower molding member MB may have a flat shape. In some example embodiments, an upper surface and a lower surface of the lead frame panel LFP may have a flat shape. The upper surface of the lower molding member MB may be on the same plane as the upper surface of the lead frame panel LFP and the lower surface of the lower molding member MB and the lower surface of the lead frame panel LFP may be on the same plane. That is, a thickness of the lower molding member MB may be substantially the same as a thickness of the lead frame panel LFP.

Figure 8E:
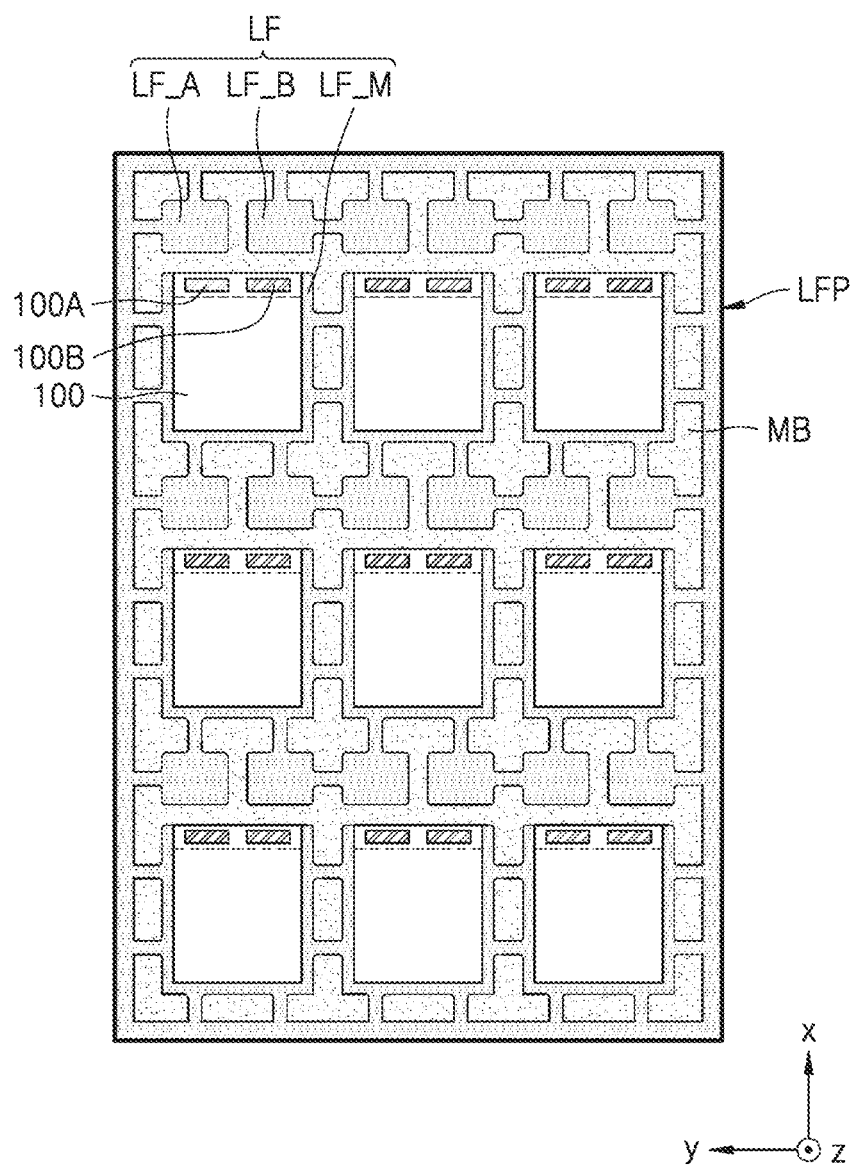

Referring to FIG. 8E, a plurality of light-emitting devices 100 may be arranged above the lead frame panel LFP.

Each of the plurality of light-emitting devices 100 may be arranged above each main frame LF_M. Each of the plurality of light-emitting devices 100 may include a certain semiconductor device emitting light having certain energy.

The first electrode 100A and the second electrode 100B may be exposed to an upper surface of each of the plurality of light-emitting devices 100.

In some example embodiments, a heat conductive pad (not shown) may be arranged on a lower surface of each of the plurality of light-emitting devices 100. Each of the plurality of light-emitting devices 100 may be stably supported and fixed by the main frame LF_M.

The heat conductive pad may discharge the heat generated in each of the plurality of light-emitting devices 100 to the outside. In some example embodiments, the heat conductive pad may be arranged between the lower surface of each of the plurality of light-emitting devices 100 and the upper surface of the lead frame panel LFP. That is, the heat conductive pad may transmit the heat generated in each of the plurality of light-emitting devices 100 to the lead frame LF.

In some example embodiments, the heat conductive pad may be bonded to the plurality of light-emitting devices 100 and/or the lead frame panel LFP based on a eutectic bonding method.

Figure 8F:
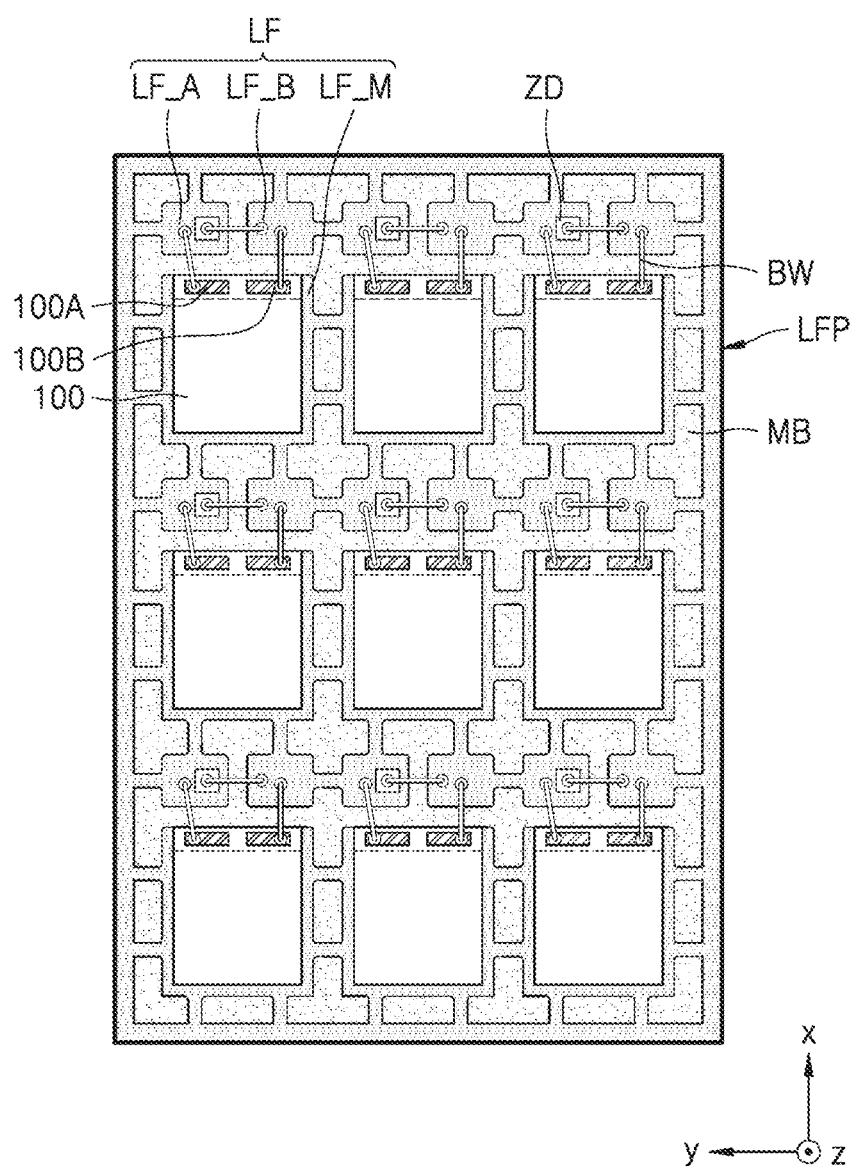

Referring to FIG. 8F, after the plurality of light-emitting devices 100 are arranged above the lead frame panel LFP, the Zener diode ZD and the bonding wires BW may be formed.

The lead frame panel LFP and the plurality of light-emitting devices 100 may be connected to each other via the bonding wires BW. In detail, the bonding wires BW electrically connecting the first electrode 100A of each of the plurality of light-emitting devices 100 to the first electrode frame LF_A may be formed, the bonding wires BW electrically connecting the second electrode 100B of each of the plurality of light-emitting devices 100 to the second electrode frame LF_B may be formed, and the bonding wires BW electrically connecting each Zener diode ZD arranged on the first electrode frame LF_A to the second electrode frame LF_B may be formed.

In some example embodiments, the bonding wires BW may be connected based on thermo compression connection or ultrasonic connection, and may also be connected based on thermosonic connection in which thermo compression connection and ultrasonic connection are combined.

Figure 8G:
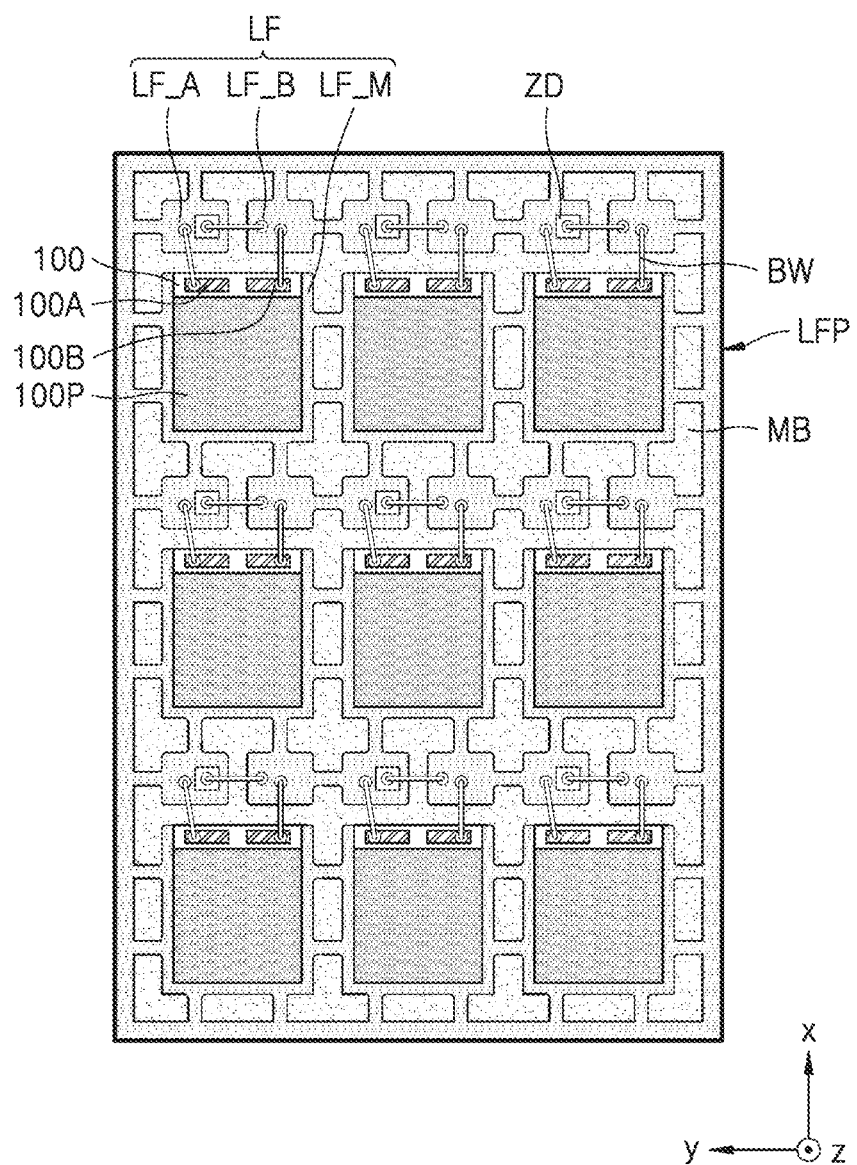

Referring to FIG. 8G, the fluorescent material 100P may be arranged on the upper surface of each of the plurality of light-emitting devices 100 in parallel with the first and second electrodes 100A and 100B.

In some example embodiments, the fluorescent material 100P may include a plate type. The fluorescent material 100P may include a resin including a wavelength-converting material. For example, the wavelength-converting material may include a fluorescent material and the resin may include a silicone resin, an epoxy resin, or a resin of a mixture thereof. The fluorescent material 100P may have an electrically insulating property. A side surface of the fluorescent material 100P and a side surface of the light-emitting device 100 may be on the same plane. The fluorescent material 100P may cover most of the area of the light-emitting device 100.

In some example embodiments, the light-emitting device 100 may include a partition structure (not shown) and the partition structure may lock the fluorescent material 100P arranged above the light-emitting device 100. That is, the fluorescent material 100P may be arranged in a cavity formed by the upper surface of the light-emitting device 100 and the partition structure. The fluorescent material 100P may be formed based on a dispensing method to fill the partition structure. The dispensed fluorescent material 100P may not spill downwards due to the partition structure.

Figure 8H:
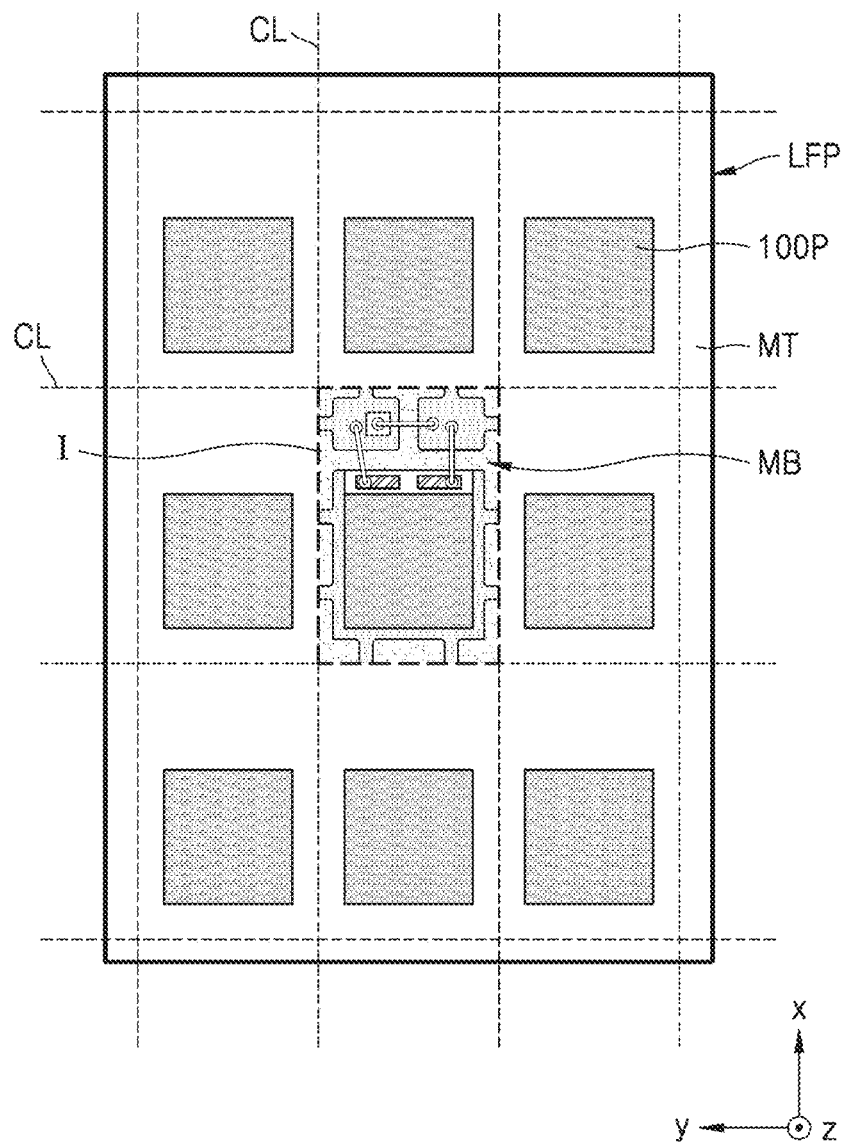

Referring to FIG. 8H, the upper molding member MT may be formed above the lower molding member MB and the lead frame panel LFP to surround the light-emitting device 100 and the bonding wires BW. For convenience of explanation, a portion I of the upper molding member MT is illustrated to be transparent.

The upper molding member MT may surround the light-emitting device 100 to protect the light-emitting device 100. In some example embodiments, the upper molding member MT may include a fluorescent material to change a wavelength of the light emitted from the light-emitting device 100.

A side surface and an upper surface of the upper molding member MT may have a rectangular shape. The upper molding member MT may protect the light-emitting device 100 from external effects, such as contamination, shocks, etc. In some example embodiments, the upper molding member MT may protect the bonding wires BW. In order to perform this function, the upper molding member MT may have a thickness at least to surround the whole light-emitting device 100. The upper molding member MT may expose an upper surface of the fluorescent material 100P.

The upper molding member MT may include a different material from the lower molding member MB. In some example embodiments, the upper molding member MT may be formed based on a transfer molding method.

Figure 8I:
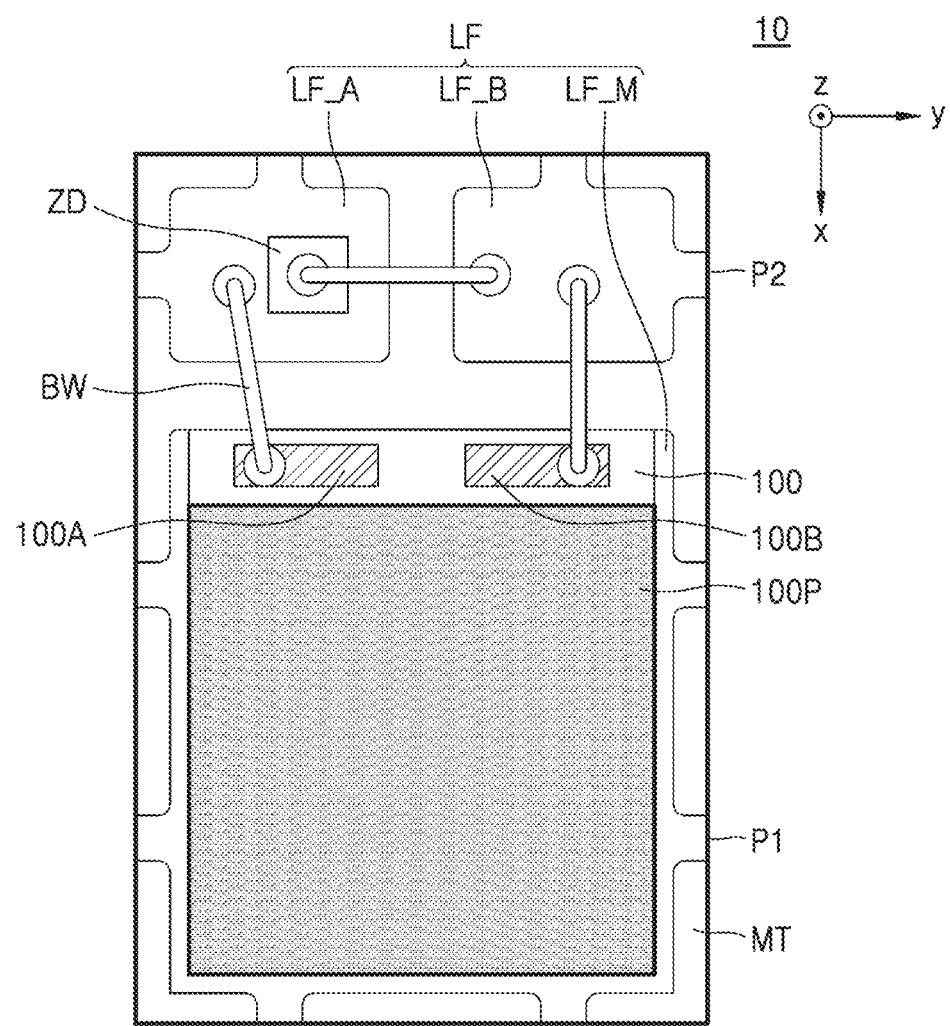

Referring to FIG. 8I, the light-emitting device packages 10 may be physically separated from each other by cutting the components, such as the lead frame panel LFP (refer to FIG. 8H), through a package cutting line CL (refer to FIG. 8H).

The light-emitting device packages 10 may be physically separated from each other by cutting the lead frame panel LFP (refer to FIG. 8H), the upper molding member MT, and the lower molding member MB along the package cutting line CL, via a blade.

The lower molding member MB may be formed around the lead frame LF to surround the lead frame LF, in each of the physically separated light-emitting device packages 10. The lead frame LF may be separated into the main frame LF_M, the first electrode frame LF_A, and the second electrode frame LF_B by the lower molding member MB. In other words, the lead frame LF may include the portions electrically separated from one another by the lower molding member MB.

The main frame LF_M may include at least one first projection portion P1 exposed through the lower molding member MB, in each of the physically separated light-emitting device packages 10. In some example embodiments, each of the first electrode frame LF_A and the second electrode frame LF_B may include at least one second projection portion P2 exposed through the lower molding member MB. That is, the first projection portion P1 and the second projection portion P2 may be exposed via the cutting of the lead frame panel LFP (refer to FIG. 8H).

Based on these manufacturing processes, the light-emitting device package 10 according to the inventive concepts may be manufactured.

While the inventive concepts have been particularly shown and described with reference to example embodiments thereof, it will be understood that various changes in form and details may be made therein without departing from the spirit and scope of the following claims.

What is claimed is:

1. A light-emitting device package, comprising:
   a package substrate surrounded by a lower molding member;
   a light-emitting device on the package substrate, the light-emitting device surrounded by an upper molding member;
   a heat conductive pad between a lower surface of the light-emitting device and an upper surface of the package substrate;
   a first electrode on an upper surface of the light-emitting device, a second electrode on the upper surface of the light-emitting device, and a fluorescent material on a portion of the upper surface of the light-emitting device, such that the light-emitting device is between the heat conductive pad and each of the first electrode, the second electrode, and the fluorescent material; and
   a plurality of bonding wires electrically respectively connecting the package substrate with the first electrode and the second electrode.

2. The light-emitting device package of claim 1, wherein an upper surface of the first electrode, an upper surface of the second electrode, and a lower surface of the fluorescent material are coplanar with each other.

3. The light-emitting device package of claim 2, wherein a longitudinal axis of the first electrode and a longitudinal axis of the second electrode extend in parallel with each other and with an edge of the light-emitting device.

4. The light-emitting device package of claim 1, wherein a side surface of the upper molding member is coplanar with a side surface of the lower molding member.

5. The light-emitting device package of claim 1, wherein the upper molding member includes a different total material composition from a total material composition of the lower molding member.

6. The light-emitting device package of claim 1, wherein an uppermost surface of the fluorescent material is distal from the lower surface of the light-emitting device in relation to an uppermost surface of the plurality of bonding wires.

7. The light-emitting device package of claim 1, further comprising:
   a partition structure covering all side walls of the fluorescent material, the partition structure having an upper surface that is coplanar with an upper surface of the fluorescent material, the partition structure including Si.

8. The light-emitting device package of claim 1, wherein
   an upper surface of the fluorescent material is exposed to an exterior of the light-emitting device package through the upper molding member, and
   a side surface of the fluorescent material is not exposed to the exterior of the light-emitting device package through the upper molding member.

9. The light-emitting device package of claim 1, wherein the lower surface of the light-emitting device is flat, and the heat conductive pad is
   bonded to the lower surface of the light-emitting device, or
   is a portion included in the lower surface of the light-emitting device.

10. The light-emitting device package of claim 1, wherein the package substrate is a lead frame, the lead frame including
    a main frame, the light-emitting device is on the main frame,
    a first electrode frame connected with the first electrode via at least one bonding wire of the plurality of bonding wires, and
    a second electrode frame connected with the second electrode via at least one other bonding wire of the plurality of bonding wires.

11. A light-emitting device package, comprising:
    a package substrate including a first electrode frame and a second electrode frame;
    a light-emitting device adjacent to the package substrate, a side surface of the light-emitting device and a side surface of the package substrate facing each other;
    a heat conductive material layer on a lower surface of the light-emitting device and adjacent to the package substrate, a side surface of the heat conductive material layer and the side surface of the package substrate facing each other;
    a first electrode on an upper surface of the light-emitting device, a second electrode on the upper surface of the light-emitting device, and a fluorescent material on the upper surface of the light-emitting device;
    a plurality of bonding wires electrically connecting the first electrode frame with the first electrode and electrically connecting the second electrode frame with the second electrode; and
    a molding member surrounding both the package substrate and the light-emitting device.

12. The light-emitting device package of claim 11, wherein a lower surface of the heat conductive material layer and an upper surface of the fluorescent material are exposed to an exterior of the light-emitting device package through the molding member.

13. The light-emitting device package of claim 11, wherein the heat conductive material layer includes a metal material.

14. The light-emitting device package of claim 11, wherein
    an upper surface of the first electrode, an upper surface of the second electrode, and a lower surface of the fluorescent material are coplanar with each other, and
    a lower surface of the package substrate is coplanar with the lower surface of the light-emitting device.

15. The light-emitting device package of claim 11, further comprising:
    a partition structure covering a side wall of the fluorescent material, the partition structure including Si.

16. A light-emitting device package, comprising:
    a package substrate surrounded by a lower molding member;
    a plurality of light-emitting devices surrounded by an upper molding member, the plurality of light-emitting devices on the package substrate;
    a heat conductive pad between a lower surface of each light-emitting device of the plurality of light-emitting devices and an upper surface of the package substrate;
    a plurality of first electrodes, each of the plurality of first electrodes on an upper surface of a respective one of the plurality of light-emitting devices, a plurality of second electrodes, each of the plurality of second electrodes on the upper surface of the respective one of the plurality of light-emitting devices, and a plurality of fluorescent materials, each of the plurality of fluorescent materials on a portion of the upper surface of the respective one of the plurality of light-emitting devices, such that each light-emitting device is between a separate heat conductive pad and each of a separate first electrode, a separate second electrode, and a separate fluorescent material; and a plurality of bonding wires electrically connecting the package substrate with each electrode of the plurality of first electrodes and the a plurality of second electrodes.

17. The light-emitting device package of claim 16, wherein the package substrate is a lead frame, the lead frame including a main frame, wherein the plurality of light-emitting devices are on the main frame, and a plurality of electrode frames connected to the plurality of bonding wires.

18. The light-emitting device package of claim 17, wherein light-emitting devices adjacent to each other from among the plurality of light-emitting devices share one electrode frame.

19. The light-emitting device package of claim 16, wherein a side surface of the upper molding member is coplanar with a side surface of the lower molding member, and an upper surface of each fluorescent material of each light-emitting device of the plurality of light-emitting devices is exposed to an exterior of the light-emitting device package through the upper molding member.

20. The light-emitting device package of claim 16, wherein an upper surface of each of the plurality of first electrodes, an upper surface of each of the plurality of second electrodes, and a lower surface of each of the plurality of fluorescent materials are coplanar with each other.

* * * * *